United States Patent
Dalmia et al.

(10) Patent No.: US 12,255,382 B2
(45) Date of Patent: Mar. 18, 2025

(54) ANTENNA MODULES AND COMMUNICATION DEVICES

(71) Applicant: Intel Corporation, Santa Clara, CA (US)

(72) Inventors: Sidharth Dalmia, Portland, OR (US); Jonathan Jensen, Portland, OR (US); Ozgur Inac, Portland, OR (US); Trang Thai, Hillsboro, OR (US); William J. Lambert, Chandler, AZ (US); Benjamin Jann, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/504,376

(22) Filed: Nov. 8, 2023

(65) Prior Publication Data

US 2024/0072419 A1    Feb. 29, 2024

Related U.S. Application Data

(60) Continuation of application No. 17/739,880, filed on May 9, 2022, now Pat. No. 11,870,132, which is a division of application No. 15/939,806, filed on Mar. 29, 2018, now Pat. No. 11,380,979.

(51) Int. Cl.
*H01Q 1/24*     (2006.01)
*H01Q 1/22*     (2006.01)
*H01Q 9/04*     (2006.01)
*H01L 23/66*    (2006.01)
*H01Q 1/38*     (2006.01)

(52) U.S. Cl.
CPC .......... *H01Q 1/243* (2013.01); *H01Q 1/2283* (2013.01); *H01Q 9/0414* (2013.01); *H01L 23/66* (2013.01); *H01L 2223/6677* (2013.01); *H01L 2924/1421* (2013.01); *H01Q 1/38* (2013.01)

(58) Field of Classification Search
CPC ............ H01Q 3/20; H01Q 3/005; H01Q 3/08; H01Q 3/243; H01Q 3/2283; H01Q 15/16; H01Q 19/13; H01Q 9/0414
See application file for complete search history.

(56) References Cited

U.S. PATENT DOCUMENTS

| | | |
|---|---|---|
| 2004/0090369 A1 | 5/2004 | Mccarrick |
| 2007/0159380 A1* | 7/2007 | Nagaishi ............... G01S 13/931 257/E25.031 |
| 2010/0090903 A1 | 4/2010 | Byun et al. |

(Continued)

FOREIGN PATENT DOCUMENTS

JP         3213873 U      12/2017

OTHER PUBLICATIONS

"Flexible flat cable", Wikipedia, https://en.wikipedia.org/wiki/Flexible_flat_cable, retrieved from the internet on Apr. 9, 2024, 3 pages.

*Primary Examiner* — Awat M Salih
(74) *Attorney, Agent, or Firm* — Akona IP PC

(57) ABSTRACT

Disclosed herein are integrated circuit (IC) packages, antenna boards, antenna modules, and communication devices (e.g., for millimeter wave communications). For example, in some embodiments, an antenna module may include: a logic die; a radio frequency front-end (RFFE) die in electrical communication with the logic die; and an antenna patch, wherein the RFFE die is closer to the antenna patch than the logic die is to the antenna patch.

20 Claims, 24 Drawing Sheets

(56) References Cited

U.S. PATENT DOCUMENTS

| | | | |
|---|---|---|---|
| 2012/0235881 A1* | 9/2012 | Pan | H01Q 21/067 |
| | | | 343/893 |
| 2016/0049723 A1* | 2/2016 | Baks | H01Q 9/0457 |
| | | | 343/848 |
| 2016/0261047 A1* | 9/2016 | Wallace | H01Q 5/40 |
| 2017/0250120 A1 | 8/2017 | Harauchi et al. | |
| 2017/0353338 A1 | 12/2017 | Amadjikpe et al. | |
| 2019/0020114 A1 | 1/2019 | Paulotto et al. | |
| 2019/0333882 A1* | 10/2019 | Kamgaing | H01L 23/49827 |
| 2020/0266549 A1 | 8/2020 | Yamamoto | |
| 2022/0246571 A1* | 8/2022 | Zhu | H01L 24/73 |

* cited by examiner

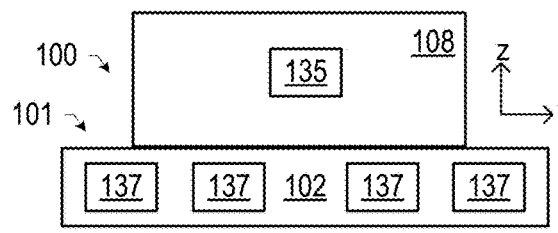
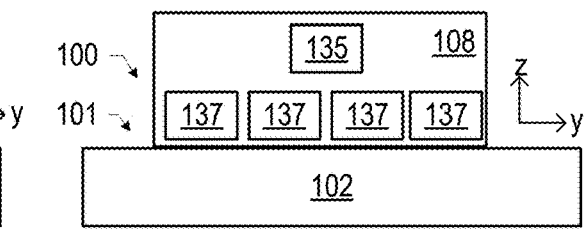
FIG. 1A  FIG. 1B
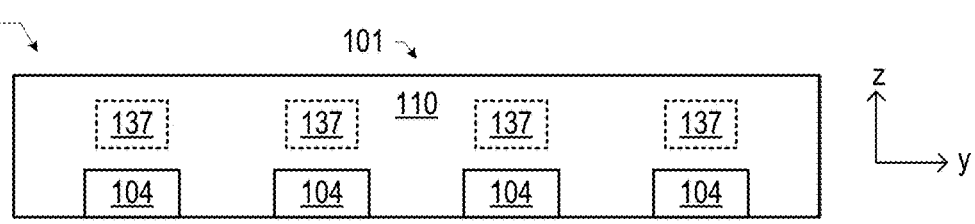
FIG. 2
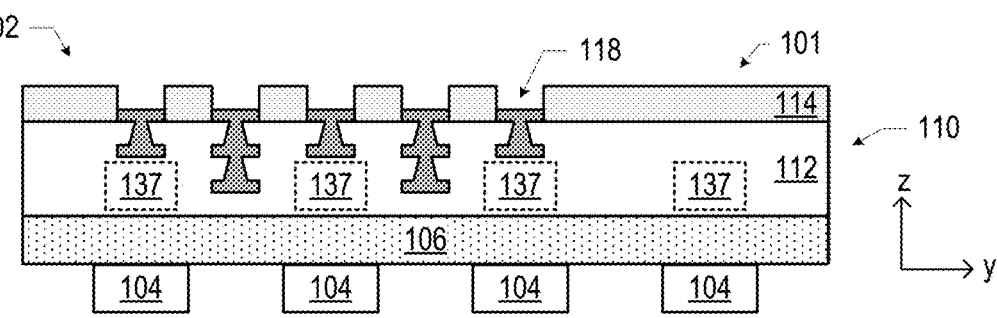
FIG. 3
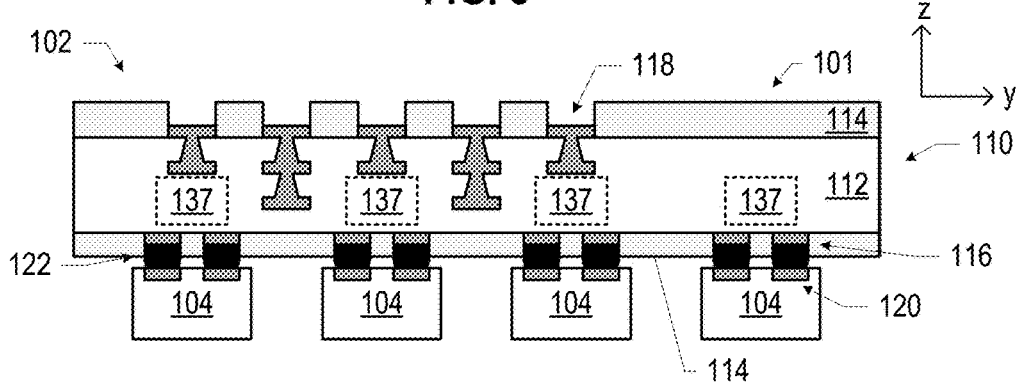
FIG. 4
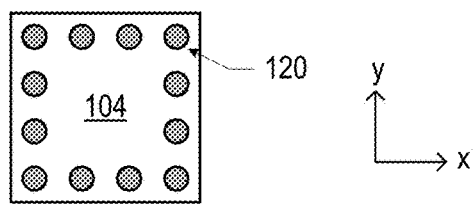
FIG. 5

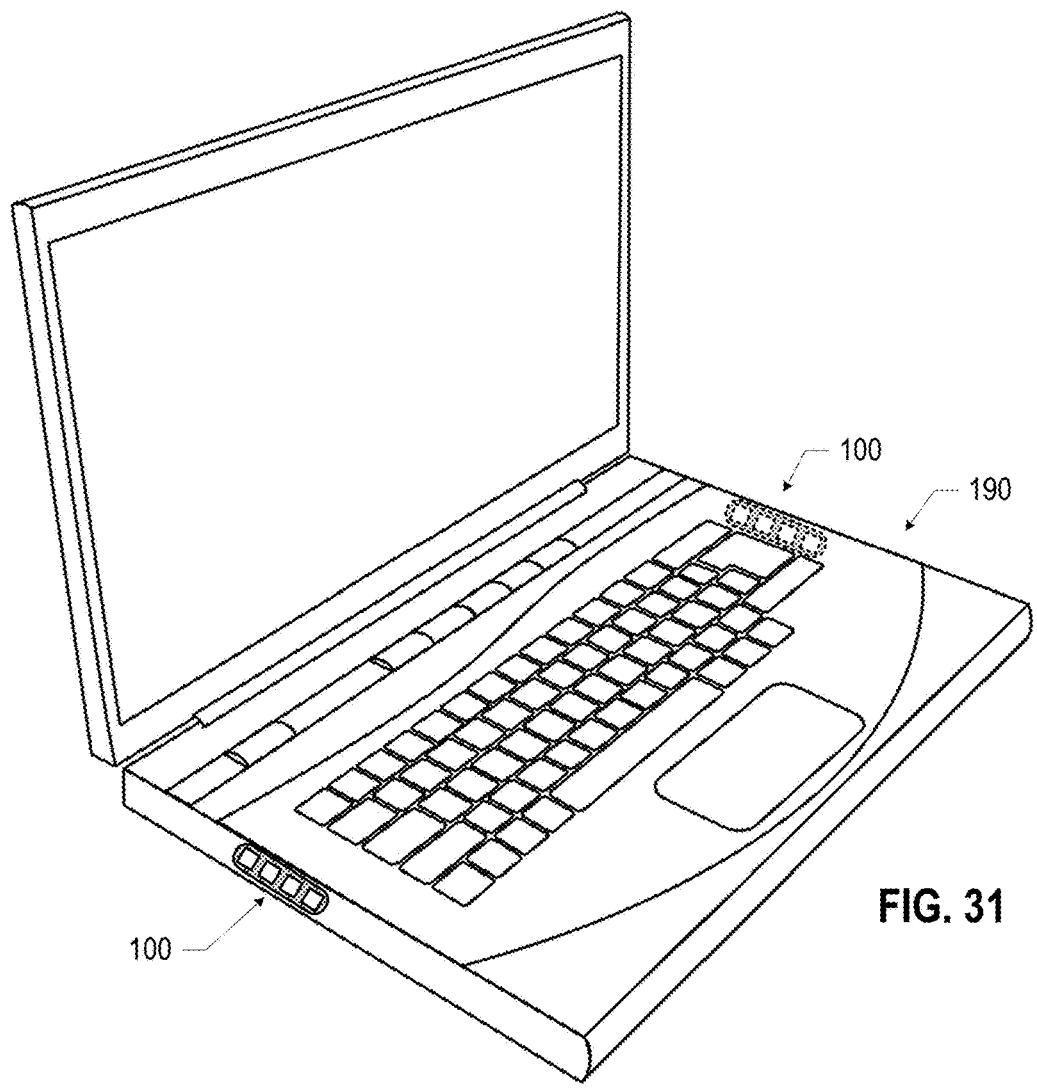
FIG. 31
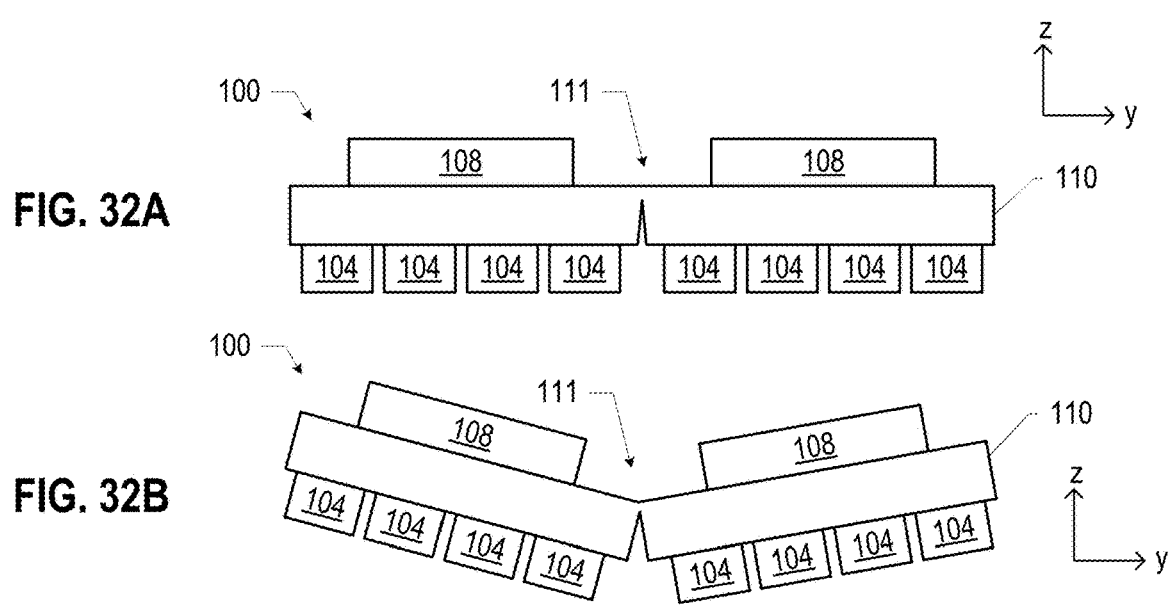
FIG. 32A
FIG. 32B

ANTENNA MODULES AND COMMUNICATION DEVICES

CROSS REFERENCE TO RELATED APPLICATIONS

This Application is a continuation of (and claims the benefit of priority under 35 U.S.C. § 120) U.S. application Ser. No. 17/739,880, filed May 9, 2022, and entitled ANTENNA MODULES AND COMMUNICATION DEVICES, which application is a divisional (and claims the benefit of priority under 35 U.S.C. § 120) of U.S. application Ser. No. 15/939,806, filed Mar. 29, 2018, now U.S. Pat. No. 11,380,979 and entitled ANTENNA MODULES AND COMMUNICATION DEVICES. The disclosures of the prior Applications are considered part of and is incorporated by reference in the disclosure of this Application.

BACKGROUND

Wireless communication devices, such as handheld computing devices and wireless access points, include antennas. The frequencies over which communication may occur may depend on the shape and arrangement of an antenna or antenna array, among other factors.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 1A and 1B are side, cross-sectional views of example antenna modules, in accordance with various embodiments.

FIGS. 2-4 are side, cross-sectional views of example antenna boards, in accordance with various embodiments.

FIG. 5 is a top view of an example antenna patch, in accordance with various embodiments.

FIG. 31 is a perspective view of a laptop communication device including multiple antenna modules, in accordance with various embodiments.

FIGS. 32A and 32B are side, cross-sectional views of example antenna modules, in accordance with various embodiments.

DETAILED DESCRIPTION

Figure 6:
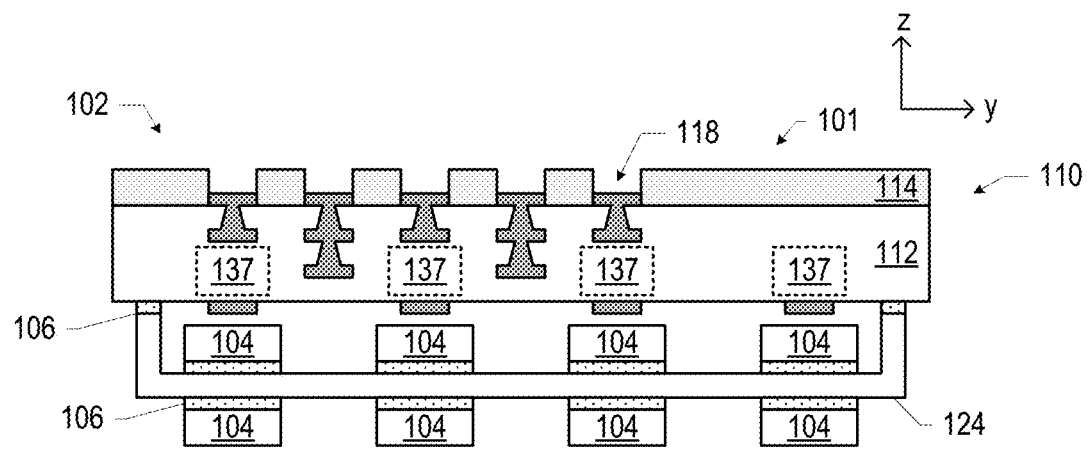
FIGS. 6-11 are side, cross-sectional views of example antenna boards, in accordance with various embodiments.

Conventional antenna arrays for millimeter wave applications have utilized circuit boards with more than 14 (e.g., more than 18) layers of dielectric/metal stack-up to achieve a desired performance. Such boards are typically expensive and low yield, as well as unbalanced in their metal density and dielectric thickness. Further, such boards may be difficult to test, and may not be readily capable of incorporating the shielding required to achieve regulatory compliance.

Disclosed herein are antenna boards, antenna modules and communication devices. For example, in some embodiments, an antenna module may include: a logic die; a radio frequency front-end (RFFE) die in electrical communication with the logic die; and an antenna patch, wherein the RFFE die is closer to the antenna patch than the logic die is to the antenna patch. In some of the embodiments disclosed herein, an antenna module may include an antenna board and one or more integrated circuit (IC) packages that may be separately fabricated and assembled, enabling increased degrees of design freedom and improved yield. Various ones of the antenna modules disclosed herein may exhibit improved efficiency and output power (a key performance indictor for mobile communication devices), little to no warpage during operation or installation, ease of assembly, low cost, fast time to market, good mechanical handling, and/or good thermal performance. For example, the antenna modules disclosed herein may achieve a net gain in power output to the antenna patches of 2 dB to 3 dB relative to conventional approaches, and may also exhibit better power amplifier efficiency and lower power consumption. Various ones of the antenna modules disclosed herein may enable millimeter wave communications in a compact and efficient form factor.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration, and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1B, the phrase "FIG. 17" may be used to refer to the collection of drawings of FIGS. 17A-17B, etc.

Any of the features discussed with reference to any of accompanying drawings herein may be combined with any other features to form an antenna board 102, an antenna module 100, or a communication device, as appropriate. A number of elements of the drawings are shared with others of the drawings; for ease of discussion, a description of these elements is not repeated, and these elements may take the form of any of the embodiments disclosed herein.

FIGS. 1A and 1B are side, cross-sectional views of example antenna modules 100, in accordance with various embodiments. The antenna modules 100 of FIG. 1 may include an IC package 108 coupled to a face 101 of an antenna board 102. Although a single IC package 108 is illustrated in the antenna modules 100 of FIG. 1, an antenna module 100 may include more than one IC package 108 (e.g., as discussed below with reference to FIGS. 26-29). As discussed in further detail below, the antenna board 102 may include conductive pathways (e.g., provided by conductive vias and lines through one or more dielectric materials) and radio frequency (RF) transmission structures (e.g., antenna feed structures, such as striplines, microstriplines, or coplanar waveguides) that may enable one or more antenna patches 104 (not shown) to transmit and receive electromagnetic waves under the control of circuitry in the IC package 108. In some embodiments, the IC package 108 may be coupled to the antenna board 102 by second-level interconnects (not shown, but discussed below with reference to FIG. 17). In some embodiments, at least a portion of the antenna board 102 may be fabricated using printed circuit board (PCB) technology, and may include between two and eight PCB layers. In some embodiments, an antenna module 100 may include a different IC package 108 for controlling each different antenna patch 104; in other embodiments, an antenna module 100 may include one IC package 108 having circuitry to control multiple antenna patches 104. In some embodiments, the total z-height of an antenna module 100 may be less than 3 millimeters (e.g., between 2 millimeters and 3 millimeters).

An antenna module 100 may include one or more logic dies 135 and one or more RFFE dies 137. For example, in the antenna modules 100 of FIG. 1, each antenna module 100 includes one logic die 135 and four RFFE dies 137; this particular number is simply illustrative, and any desired number may be used (e.g., in accordance with any of the embodiments illustrated in FIGS. 25-30). In some embodiments, the number of RFFE dies 137 in an antenna module 100 may be equal to the number of antenna patches 104 (not shown in FIG. 1) in the antenna module 100; in other embodiments, the number of RFFE dies 137 may be smaller than the number of antenna patches 104. In some embodiments, the number of logic dies 135 in an antenna module 100 may be equal to the number of RFFE dies 137 in the antenna module 100; in other embodiments, the number of logic dies 135 may be smaller than the number of RFFE dies 137. In some embodiments, the RFFE dies 137 may have a thickness between 50 microns and 200 microns (e.g., between 60 microns and 70 microns).

Figure 37:
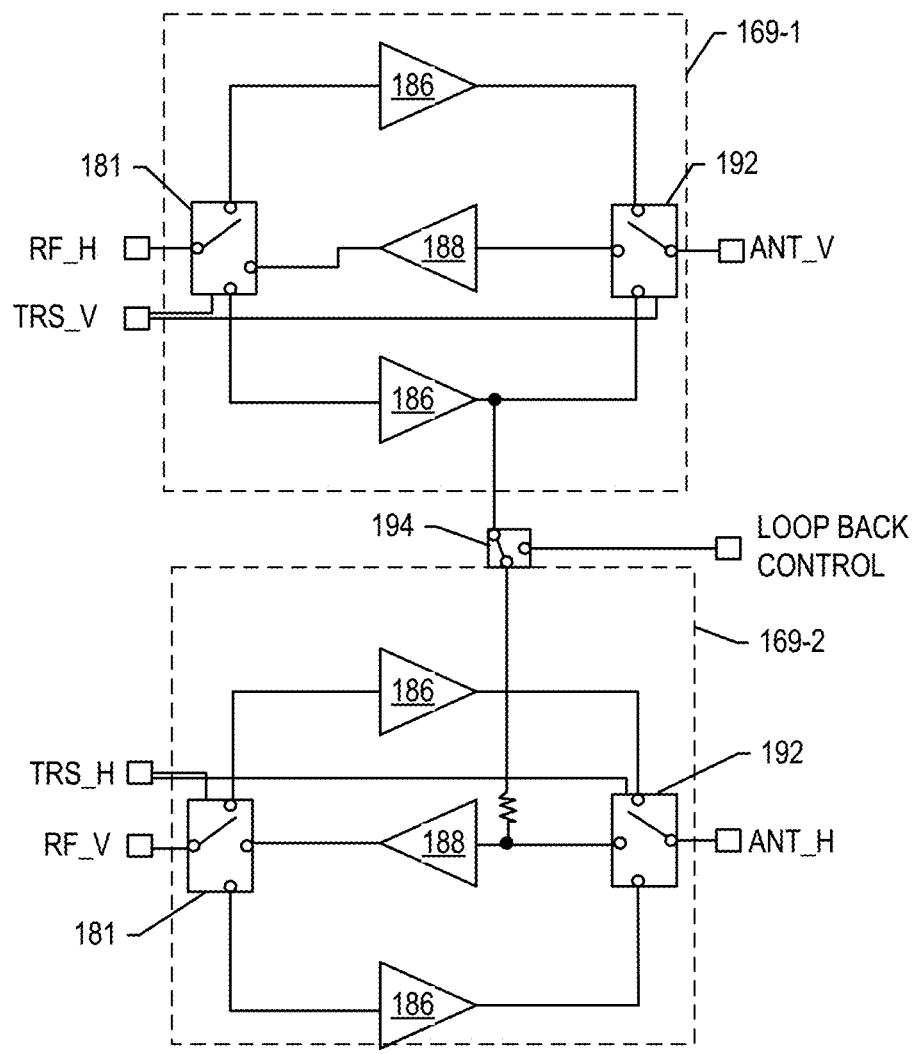
FIG. 37 illustrates example circuitry that may be included in a radio frequency front-end (RFFE) die, in accordance with various embodiments.

An antenna module 100 may include electrical pathways between the logic die 135 and one or more of the RFFE dies 137. A logic die 135 may include logic circuitry to control the operation of the RFFE die 137. For example, a logic die 135 may include complementary metal-oxide-semiconductor (CMOS) logic, and may provide electrical signals to an RFFE die 137 to control operation of the RFFE die 137. In some embodiments, a logic die 15 may include circuitry to implement a state machine, mixer circuitry, voltage-controlled oscillators, etc. An RFFE die 137 may include front-end circuitry for, along with the antenna patches 104, performing RF communications. For example, an RFFE die may include one or more power amplifiers (PAs), one or more low noise amplifiers (LNAs), phase shifters, and/or other front-end circuitry. FIG. 37, discussed below, illustrates some example circuitry that may be included in an RFFE die 137. In some embodiments, a logic die 135 may also include one or more amplifiers (e.g., a CMOS PA and/or a CMOS LNA). The RFFE die 137 may have higher output power than the logic die 135. For example, the logic die 135 may have an output power between 0 dbm and 5 dbm, while the RFFE die 137 may have an output power between 20 dbm and 35 dbm (e.g., between 100 milliwatts and 2 watts).

In an antenna module 100, the RFFE die 137 may be closer to an associated antenna patch 104 than that antenna patch 104 is to the logic die 135. In some embodiments, the RFFE die 137 may be between the antenna patch 104 and the logic die 135; as used herein, a first element may be "between" two other elements if the first element is in a layer or plane that is between the layers or planes in which the other elements are located. Because losses in an RF communication system increase over distance, having the RFFE die 137 close to an associated antenna patch 104 may reduce the losses relative to an embodiment in which the circuitry of the RFFE die 137 is included in a single die along with the circuitry in the logic die 135. For example, power levels of a PA in the RFFE die 137 may be controlled to improve or optimize throughput and battery life in mobile communication devices, relative to conventional approaches. The antenna modules 100 disclosed herein may decrease the distance between the front-end circuitry (included in the RFFE dies 137 disclosed herein) and the antenna patches 104 by a factor of two or three, relative to previous approaches.

Further, separating the circuitry of the logic die 135 from the circuitry of the RFFE die 137 may allow the logic die 135 and the RFFE die 137 to utilize different IC technologies to improve or optimize their respective functionalities; for example, in some embodiments, the logic die 135 may be based on silicon technology, while the RFFE die 137 may be based on Ill-V material technology (e.g., including gallium nitride, gallium arsenide, or indium phosphide) or another technology (e.g., silicon-on-insulator, or silicon germanium bipolar heterojunction transistors).

The logic die 135 may be included in the IC package 108 of an antenna module 100. In the antenna module 100 of FIG. 1A, the RFFE dies 137 are included in the antenna board 102, while in the antenna module 100 of FIG. 1B, the RFFE dies 137 are included in the IC package 108. In both embodiments, the RFFE dies 137 may be between the logic die 135 and the antenna patches 104 (not shown in FIG. 1). A number of embodiments of antenna boards 102 (including and not including RFFE dies 137) and IC packages 108 (including and not including RFFE dies 137) are discussed below. An antenna module 100 may also include circuitry to support the operation of the RFFE dies 137, such as filters, couplers, high quality factor inductors, combiners, and/or matching networks; this circuitry may be included in the antenna board 102 when the RFFE dies 137 are included in the antenna board 102, or may be included in the IC package 108 when the RFFE dies 137 are included in the IC package 108.

FIGS. 2-4 are side, cross-sectional views of example antenna boards 102, in accordance with various embodiments. The antenna boards 102 of FIGS. 2-4 may be used in any suitable ones of the antenna modules 100 disclosed herein. In FIGS. 2-4, and other of the accompanying drawings, RFFE dies 137 are illustrated in dotted lines in an antenna board 102; this is to indicate that RFFE dies 137 may be embedded in these antenna boards 102 (e.g., as discussed above with reference to FIG. 1A) or may not be embedded in these antenna boards 102 (e.g., as discussed above with reference to FIG. 1B).

FIG. 2 is a generalized representation of an example antenna board 102 including one or more antenna patches 104 coupled to an antenna patch support 110. In some embodiments, the antenna patches 104 may be electrically coupled to the antenna patch support 110 by electrically conductive material pathways through the antenna patch support 110 that makes conductive contact with electrically conductive material of the antenna patches 104, while in other embodiments, the antenna patches 104 may be mechanically coupled to the antenna patch support 110 but may not be in contact with an electrically conductive material pathway through the antenna patch support 110. In some embodiments, at least a portion of the antenna patch support 110 may be fabricated using PCB technology, and may include between two and eight PCB layers. Although a particular number of antenna patches 104 is depicted in FIG. 2 (and others of the accompanying drawings), this is simply illustrative, and an antenna board 102 may include fewer or more antenna patches 104. For example, an antenna board 102 may include four antenna patches 104 (e.g., arranged in a linear array, as discussed below with reference to FIGS. 21-23 and 31), eight antenna patches 104 (e.g., arranged in one linear array, or two linear arrays as discussed below with reference to FIGS. 27, 29, and 30), sixteen antenna patches 104 (e.g., arranged in a 4×4 array, as discussed below with reference to FIGS. 26 and 28), or thirty-two antenna patches 104 (e.g., arranged in two 4×4 arrays, as discussed below with reference to FIGS. 26 and 28). In some embodiments, the antenna patches 104 may be surface mount components. In embodiments in which the antenna board 102 of FIG. 2 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

In some embodiments, an antenna module 100 may include one or more arrays of antenna patches 104 to support multiple communication bands (e.g., dual band operation or tri-band operation). For example, the antenna modules 100 disclosed herein may be configured to support tri-band operation at 28 gigahertz, 39 gigahertz, and 60 gigahertz. The antenna modules 100 disclosed herein may be configured to support tri-band operation at 24 gigahertz to 29 gigahertz, 37 gigahertz to 43 gigahertz, and 57 gigahertz to 71 gigahertz. The antenna modules 100 disclosed herein may be configured to support 5G millimeter wave communications and 60 gigahertz communications. The antenna modules 100 disclosed herein may be configured to support 28 gigahertz and 39 gigahertz communications. The antenna modules 100 disclosed herein may be configured to support millimeter wave communications. The antenna modules 100 disclosed herein may be configured to support high band frequencies and low band frequencies. The antenna modules 100 disclosed herein may be configured to support ones of the 5G bands with higher output power (e.g., 24.25 gigahertz to 29.5 gigahertz, and 37 gigahertz to 43.5 gigahertz).

In some embodiments, an antenna board 102 may include an antenna patch 104 coupled to an antenna patch support 110 by an adhesive. FIG. 3 illustrates an antenna board 102 in which the antenna patch support 110 includes a circuit board 112 (e.g., including between two and eight PCB layers), a solder resist 114 and conductive contacts 118 at one face of the circuit board 112, and an adhesive 106 at the opposite face of the circuit board 112. As used herein, a "conductive contact" may refer to a portion of conductive material (e.g., metal) serving as an interface between different components; conductive contacts may be recessed in, flush with, or extending away from a surface of a component, and may take any suitable form (e.g., a conductive pad or socket). The circuit board 112 may include traces, vias, and other structures, as known in the art, formed of an electrically conductive material (e.g., a metal, such as copper). The conductive structures in the circuit board 112 may be electrically insulated from each other by a dielectric material. Any suitable dielectric material may be used (e.g., a laminate material). In some embodiments, the dielectric material may be an organic dielectric material, a fire retardant grade 4 material (FR-4), bismaleimide triazine (BT) resin, polyimide materials, glass reinforced epoxy matrix materials, or low-k and ultra low-k dielectric (e.g., carbon-doped dielectrics, fluorine-doped dielectrics, porous dielectrics, and organic polymeric dielectrics).

In the embodiment of FIG. 3, the antenna patches 104 may be adhered to the adhesive 106. The adhesive 106 may be electrically non-conductive, and thus the antenna patches 104 may not be electrically coupled to the circuit board 112 by an electrically conductive material pathway. In some embodiments, the adhesive 106 may be an epoxy. The thickness of the adhesive 106 may control the distance between the antenna patches 104 and the proximate face of the circuit board 112. When the antenna board 102 of FIG. 3 (and others of the accompanying drawings) is used in an antenna module 100, an IC package 108 may be coupled to some of the conductive contacts 118. In some embodiments, a thickness of the circuit board 112 of FIG. 3 may be less than 1 millimeter (e.g., between 0.35 millimeters and 0.5 millimeters). In some embodiments, a thickness of an antenna patch 104 may be less than 1 millimeter (e.g., between 0.4 millimeters and 0.7 millimeters). In embodiments in which the antenna board 102 of FIG. 3 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

In some embodiments, an antenna board 102 may include an antenna patch 104 coupled to an antenna patch support 110 by solder. FIG. 4 illustrates an antenna board 102 in which the antenna patch support 110 includes a circuit board 112 (e.g., including between two and eight PCB layers), a solder resist 114 and conductive contacts 118 at one face of the circuit board 112, and a solder resist 114 and conductive contacts 116 at the opposite face of the circuit board 112. The antenna patches 104 may be secured to the circuit board 112 by solder 122 (or other second-level interconnects) between conductive contacts 120 of the antenna patches 104 and the conductive contacts 116. In some embodiments, the conductive contacts 116/solder 122/conductive contacts 120 may provide an electrically conductive material pathway through which signals may be transmitted to or from the antenna patches 104. In other embodiments, the conductive contacts 116/solder 122/conductive contacts 120 may be used only for mechanical coupling between the antenna patches 104 and the antenna patch support 110. The height of the solder 122 (or other interconnects) may control the distance between the antenna patches 104 and the proximate face of the circuit board 112. In embodiments in which the antenna board 102 of FIG. 4 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

FIG. 5 is a top view of an example antenna patch 104 that may be used in an antenna board 102 like the antenna board 102 of FIG. 4, in accordance with various embodiments. The antenna patch 104 of FIG. 5 may have a number of conductive contacts 120 distributed regularly on one face, close to the edges; other antenna patches 104 with conductive contacts 120 may have other arrangements of the conductive contacts 120.

In some embodiments, an antenna board may include an antenna patch 104 coupled to a bridge structure. FIG. 6 illustrates an antenna board 102 in which the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna patches 104 coupled to an interior face of the bridge structure 124, and one or more antenna patches 104 coupled to an exterior face of the bridge structure 124. In the embodiment of FIG. 6, the antenna patches 104 are coupled to the bridge structures 124 by an adhesive 106. In the embodiment of FIG. 6, the bridge structure 124 may be coupled to the circuit board 112 by an adhesive 106. The thickness of the adhesive 106 and the dimensions of the bridge structure 124 (i.e., the distance between the interior face and the proximate face of the circuit board 112, and the thickness of the bridge structure 124 between the interior face and the exterior face) may control the distance between the antenna patches 104 and the proximate face of the circuit board 112 (including the distance between the "interior" antenna patches 104 and the "exterior" antenna patches 104). The bridge structure 124 may be formed of any suitable material; for example, the bridge structure 124 may be formed of a non-conductive plastic. In some embodiments, the bridge structure 124 of FIG. 6 may be manufactured using three-dimensional printing techniques. In some embodiments, the bridge structure 124 of FIG. 6 may be manufactured as a PCB with a recess defining the interior face (e.g., using recessed board manufacturing technology). In the embodiment of FIG. 6, the bridge structure 124 may introduce an air gap between the antenna patches 104 and the circuit board 112, enhancing the bandwidth of the antenna module 100. In embodiments in which the antenna board 102 of FIG. 6 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

Figure 7:
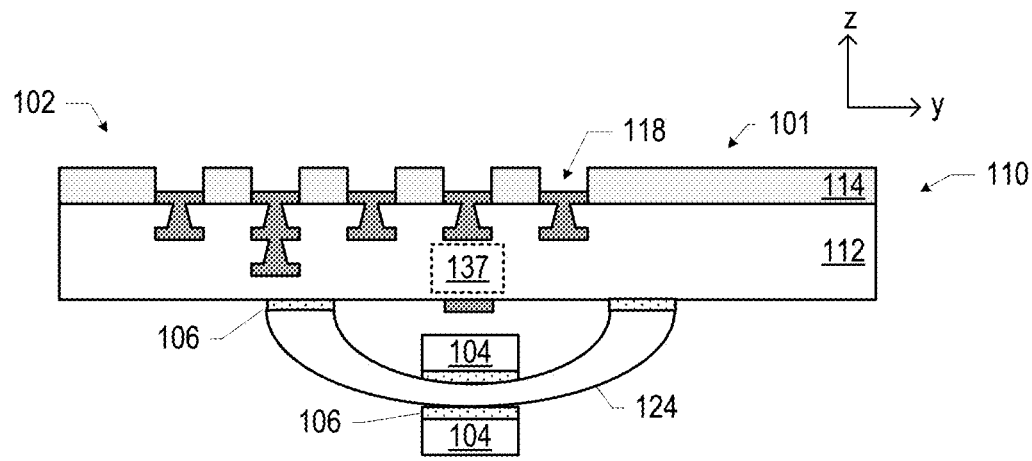

FIG. 7 illustrates an antenna board 102 similar to the antenna board 102 of FIG. 6, but in which the bridge structure 124 is curved (e.g., has the shape of an arch). Such a bridge structure 124 may be formed from a flexible plastic or other material, for example. In the antenna board 102 of FIG. 7, the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna patches 104 coupled to an interior face of the bridge structure 124, and one or more antenna patches 104 coupled to an exterior face of the bridge structure 124. In the embodiment of FIG. 7, the antenna patches 104 are coupled to the bridge structures 124 by an adhesive 106. In the embodiment of FIG. 6, the bridge structure 124 may be coupled to the circuit board 112 by an adhesive 106. The thickness of the adhesive 106 and the dimensions of the bridge structure 124 (i.e., the distance between the interior face and the proximate face of the circuit board 112, and the thickness of the bridge structure 124 between the interior face and the exterior face) may control the distance between the antenna patches 104 and the proximate face of the circuit board 112 (including the distance between the "interior" antenna patches 104 and the "exterior" antenna patches 104). The bridge structure 124 of FIG. 7 may be formed of any suitable material; for example, the bridge structure 124 may be formed of a non-conductive plastic. In the embodiment of FIG. 7, the bridge structure 124 may introduce an air gap between the antenna patches 104 and the circuit board 112, enhancing the bandwidth of the antenna module 100. In embodiments in which the antenna board 102 of FIG. 7 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

Figure 8:
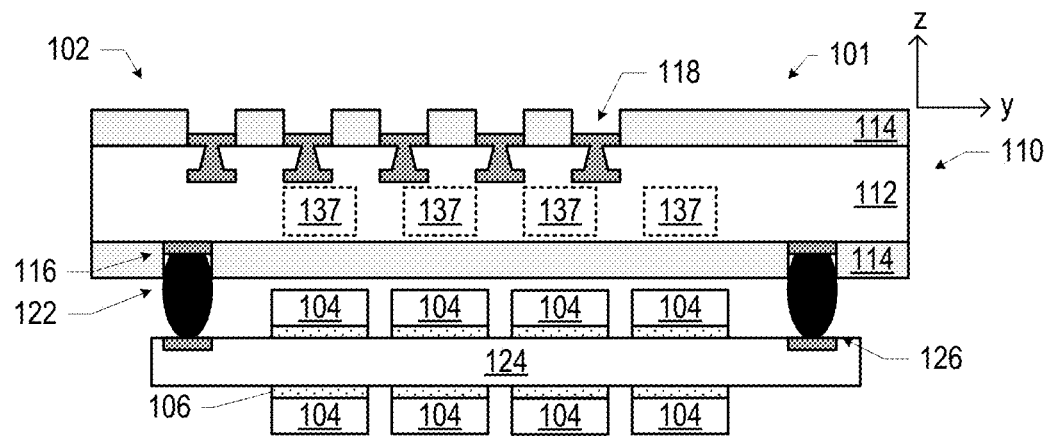

FIG. 8 illustrates an antenna board 102 similar to the antenna board 102 of FIGS. 6 and 7, but in which the bridge structure 124 is itself a planar circuit board or other structure with conductive contacts 126; the bridge structure 124 may be coupled to the circuit board 112 by solder 122 (or other interconnects) between the conductive contacts 126 and the conductive contacts 116 on the circuit board 112. In the antenna board 102 of FIG. 8, the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna patches 104 coupled to an interior face of the bridge structure 124, and one or more antenna patches 104 coupled to an exterior face of the bridge structure 124. In the embodiment of FIG. 8, the antenna patches 104 are coupled to the bridge structure 124 by an adhesive 106. The thickness of the adhesive 106, the height of the solder 122, and the dimensions of the bridge structure 124 (i.e., the thickness of the bridge structure 124 between the interior face and the exterior face) may control the distance between the antenna patches 104 and the proximate face of the circuit board 112 (including the distance between the "interior" antenna patches 104 and the "exterior" antenna patches 104). The bridge structure 124 of FIG. 8 may be formed of any suitable material; for example, the bridge structure 124 may be formed of a non-conductive plastic or a PCB. In embodiments in which the bridge structure 124 is a PCB, the total number of layers in the bridge structure 124 and the circuit board 112 may be equal to six or more; fabricating them as two separate PCBs with fewer layers to accommodate the air gap may be less expensive and/or less complex than fabricating a PCB with six or more layers. In the embodiment of FIG. 8, the bridge structure 124 may introduce an air gap between the antenna patches 104 and the circuit board 112, enhancing the bandwidth of the antenna module 100. In embodiments in which the antenna board 102 of FIG. 8 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

Figure 9:
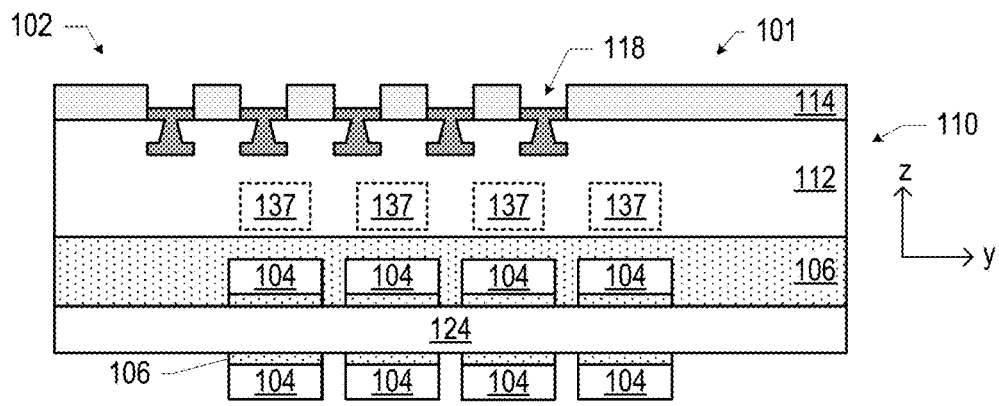

FIG. 9 illustrates an antenna board 102 similar to the antenna board 102 of FIG. 8, but in which the bridge structure 124 is itself a planar circuit board or other structure, and the bridge structure 124 and the antenna patches 104 coupled thereto are all coupled to the circuit board 112 by an adhesive 106. In the antenna board 102 of FIG. 9, the antenna patch support 110 includes a circuit board 112 (e.g., including between two and eight PCB layers), a solder resist 114 and conductive contacts 118 at one face of the circuit board 112, and a bridge structure 124 secured to the opposite face of the circuit board 112. The bridge structure 124 may have one or more antenna patches 104 coupled to an interior face of the bridge structure 124, and one or more antenna patches 104 coupled to an exterior face of the bridge structure 124. In the embodiment of FIG. 9, the antenna patches 104 are coupled to the bridge structures 124 by an adhesive 106. The thickness of the adhesive 106 and the dimensions of the bridge structure 124 (i.e., the thickness of the bridge structure 124 between the interior face and the exterior face) may control the distance between the antenna patches 104 and the proximate face of the circuit board 112 (including the distance between the "interior" antenna patches 104 and the "exterior" antenna patches 104). The bridge structure 124 of FIG. 9 may be formed of any suitable material; for example, the bridge structure 124 may be formed of a non-conductive plastic or a PCB. In some embodiments, the circuit board 112 may be a 1-2-1 cored board, and the bridge structure 124 may be a 0-2-0 cored board. In some embodiments, the circuit board 112 may use a dielectric material different from a dielectric material of the bridge structure 124 (e.g., the bridge structure 124 may include polytetrafluoroethylene (PTFE) or a PTFE-based material), and the circuit board 112 may include another dielectric material). In embodiments in which the antenna board 102 of FIG. 9 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

Figure 10:
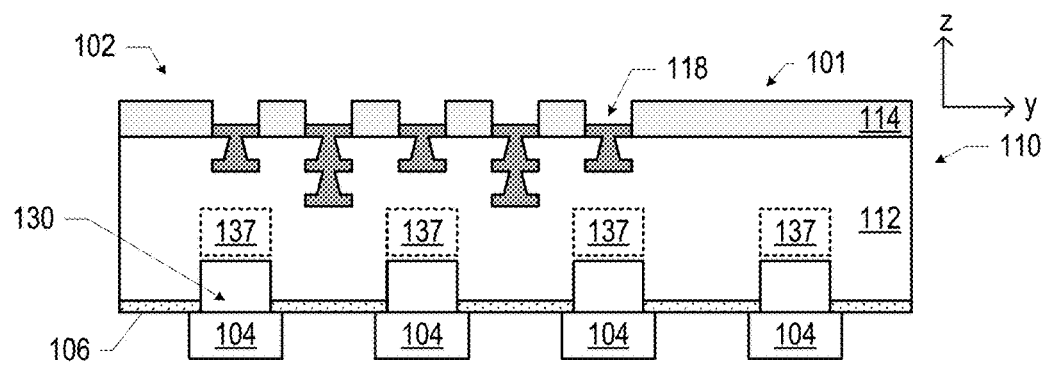

In some embodiments, an antenna board 102 may include cavities "above" the antenna patches 102 to provide an air gap between the antenna patches 102 and other portions of the antenna board 102. FIG. 10 illustrates an antenna board 102 similar to the antenna board 102 of FIG. 3, but in which the circuit board 112 includes cavities 130 positioned "above" each of the antenna patches 104. These cavities 130 may provide air gaps between the antenna patches 104 and the rest of the antenna board 102, which may improve performance. In the embodiment of FIG. 10, the antenna patch support 110 includes a circuit board 112 (e.g., including between two and eight PCB layers), a solder resist 114 and conductive contacts 118 at one face of the circuit board 112, and an adhesive 106 at the opposite face of the circuit board 112. The antenna patches 104 may be adhered to the adhesive 106. The adhesive 106 may be electrically non-conductive, and thus the antenna patches 104 may not be electrically coupled to the circuit board 112 by an electrically conductive material pathway. In some embodiments, the adhesive 106 may be an epoxy. The thickness of the adhesive 106 may control the distance between the antenna patches 104 and the proximate face of the circuit board 112. In some embodiments, the cavities 130 may have a depth between 200 microns and 400 microns. In embodiments in which the antenna board 102 of FIG. 10 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

Figure 11:
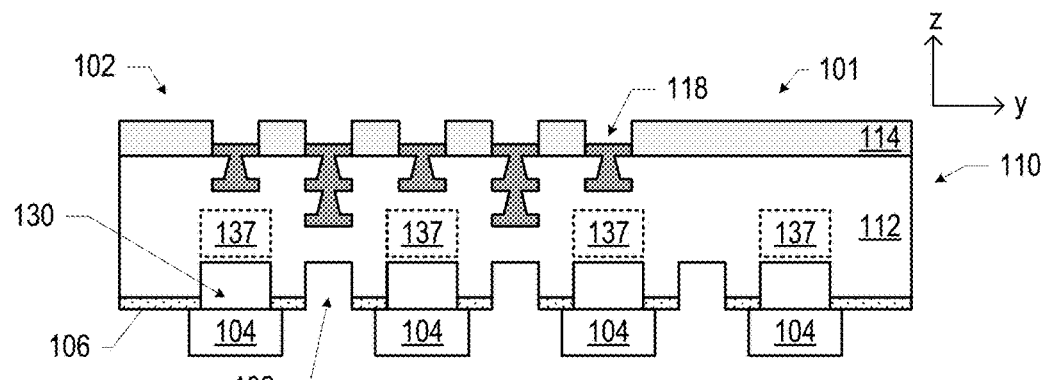

In some embodiments, an antenna board 102 may include cavities that are not "above" the antenna patches 102, but that are located between the attachment locations of different ones of the antenna patches 104 to the circuit board 112. For example, FIG. 11 illustrates an antenna board 102 similar to the antenna board 102 of FIG. 10, but in which the circuit board 112 includes additional cavities 132 positioned "between" each of the antenna patches 104. These cavities 132 may help isolate different ones of the antenna patches 104 from each other, thereby improving performance. In the embodiment of FIG. 11, the antenna patch support 110 includes a circuit board 112 (e.g., including between two and eight PCB layers), a solder resist 114 and conductive contacts 118 at one face of the circuit board 112, and an adhesive 106 at the opposite face of the circuit board 112. The antenna patches 104 may be adhered to the adhesive 106. The adhesive 106 may be electrically non-conductive, and thus the antenna patches 104 may not be electrically coupled to the circuit board 112 by an electrically conductive material pathway. In some embodiments, the adhesive 106 may be an epoxy. The thickness of the adhesive 106 may control the distance between the antenna patches 104 and the proximate face of the circuit board 112. In some embodiments, the cavities 132 may have a depth between 200 microns and 400 microns. In some embodiments, the cavities 132 may be through-holes (i.e., the cavities 132 may extend all the way through the circuit board 112). In embodiments in which the antenna board 102 of FIG. 11 includes one or more RFFE dies 137, the RFFE dies 137 may be located proximate to associated antenna patches 104, and the antenna board 102 may include electrical pathways between the RFFE dies 137 and the face 101 of the antenna board 102 (e.g., to which an IC package 108 may electrically couple).

Figure 12:
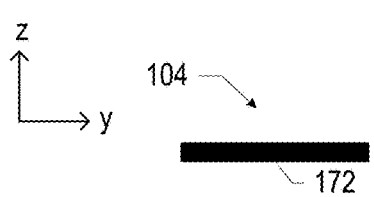
FIGS. 12 and 13 are side, cross-sectional views of example antenna patches, in accordance with various embodiments.
Figure 13:
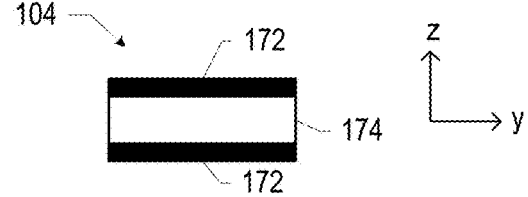

Any suitable antenna structures may provide the antenna patches 104 of an antenna module 100. In some embodiments, an antenna patch 104 may include one, two, three, or more antenna layers. For example, FIGS. 12 and 13 are side, cross-sectional views of example antenna patches 104, in accordance with various embodiments. In FIG. 12, the antenna patch 104 includes one antenna layer 172, while in FIG. 13, the antenna patch 104 includes two antenna layers 172 spaced apart by an intervening structure 174.

Figure 14:
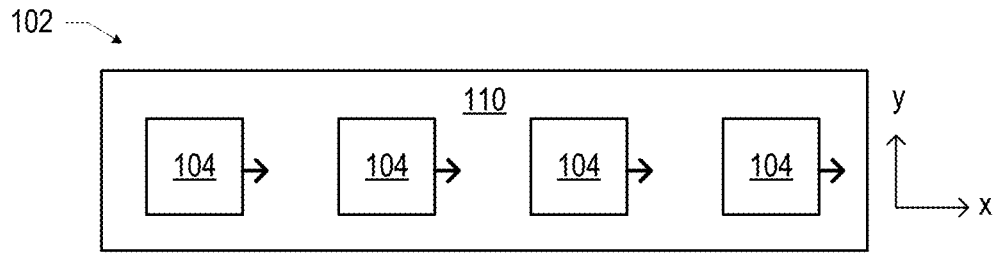
FIGS. 14 and 15 are bottom views of example antenna patch arrangements in an antenna board, in accordance with various embodiments.
Figure 15:
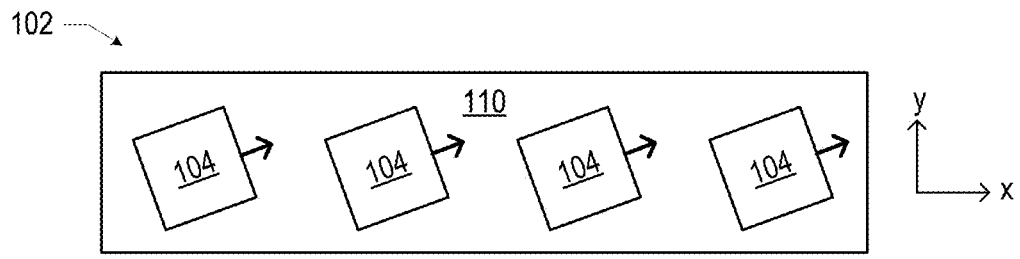
Figure 16:
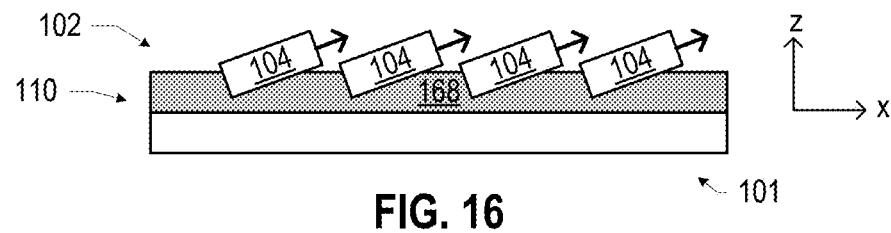
FIG. 16 is a side, cross-sectional view of an example antenna patch arrangement in an antenna board, in accordance with various embodiments.

In an antenna module 100 that includes multiple antenna patches 104, these multiple antenna patches 104 may be arranged in any suitable manner. For example, FIGS. 14 and 15 are bottom views of example arrangements of antenna patches 104 in an antenna board 102, in accordance with various embodiments. In the embodiment of FIG. 14, the antenna patches 104 are arranged in a linear array in the x-direction, and the x-axes of each of the antenna patches 104 (indicated in FIG. 14 by small arrows proximate to each antenna patch 104) are aligned with the axis of the linear array. In other embodiments, the antenna patches 104 may be arranged so that one or more of their axes are not aligned with the direction of the array. For example, FIG. 15 illustrates an embodiment in which the antenna patches 104 are distributed in a linear array in the x-direction, but the antenna patches 104 have been rotated in the x-y plane (relative to the embodiment of FIG. 14) so that the x-axis of each of the antenna patches 104 is not aligned with the axis of the linear array. In another example, FIG. 16 illustrates an embodiment in which the antenna patches 104 are distributed in a linear array in the x-direction, but the antenna patches have been rotated in the x-z plane (relative to the embodiment of FIG. 14) so that the x-axis of each of the antenna patches 104 is not aligned with the axis of the linear array. In the embodiment of FIG. 16, the antenna patch support 110 may include an antenna patch fixture 164 that may maintain the antenna patches 104 at the desired angle. In some embodiments, the "rotations" of FIGS. 15 and 16 may be combined so that an antenna patch 104 is rotated in both the x-y and the x-z plane when the antenna patch 104 is part of a linear array distributed in the x-direction. In some embodiments, some but not all of the antenna patches 104 in a linear array may be "rotated" relative to the axis of the array. Rotating an antenna patch 104 relative to the direction of the array may reduce patch-to-patch coupling (by reducing the constructive addition of resonant currents between antenna patches 104), improving the impedance bandwidth and the beam steering range. The arrangements of FIGS. 14-16 (and combinations of such arrangements) is referred to herein as the antenna patches 104 being "rotationally offset" from the linear array. The antenna boards 102 of FIGS. 14-16 may or may not include RFFE dies 137 (not shown), as discussed above.

Figure 17A:
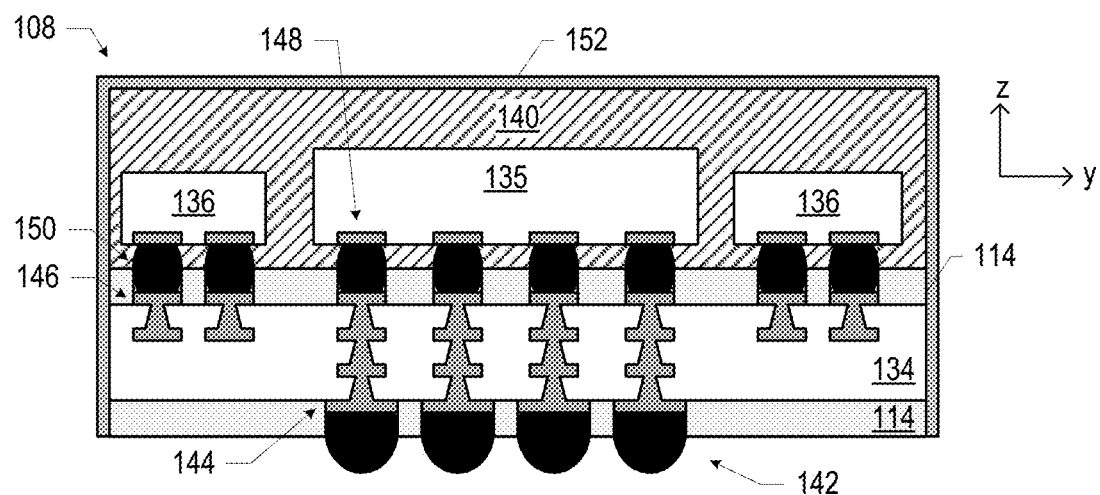
FIGS. 17A and 17B are side, cross-sectional views of example integrated circuit (IC) packages that may be included in an antenna module, in accordance with various embodiments.

The IC package 108 included in an antenna module 100 may have any suitable structure. For example, FIG. 17A illustrates an example IC package 108 that may be included in an antenna module 100, in accordance with the embodiment of FIG. 1A. The IC package 108 may include a package substrate 134 to which a logic die 135 and one or more components 136 may be coupled by first-level interconnects 150. In particular, conductive contacts 146 at one face of the package substrate 134 may be coupled to conductive contacts 148 at faces of the logic die 135 and the components 136 by first-level interconnects 150. The first-level interconnects 150 illustrated in FIG. 17A are solder bumps, but any suitable first-level interconnects 150 may be used. A solder resist 114 may be disposed around the conductive contacts 146.

Figure 17B:
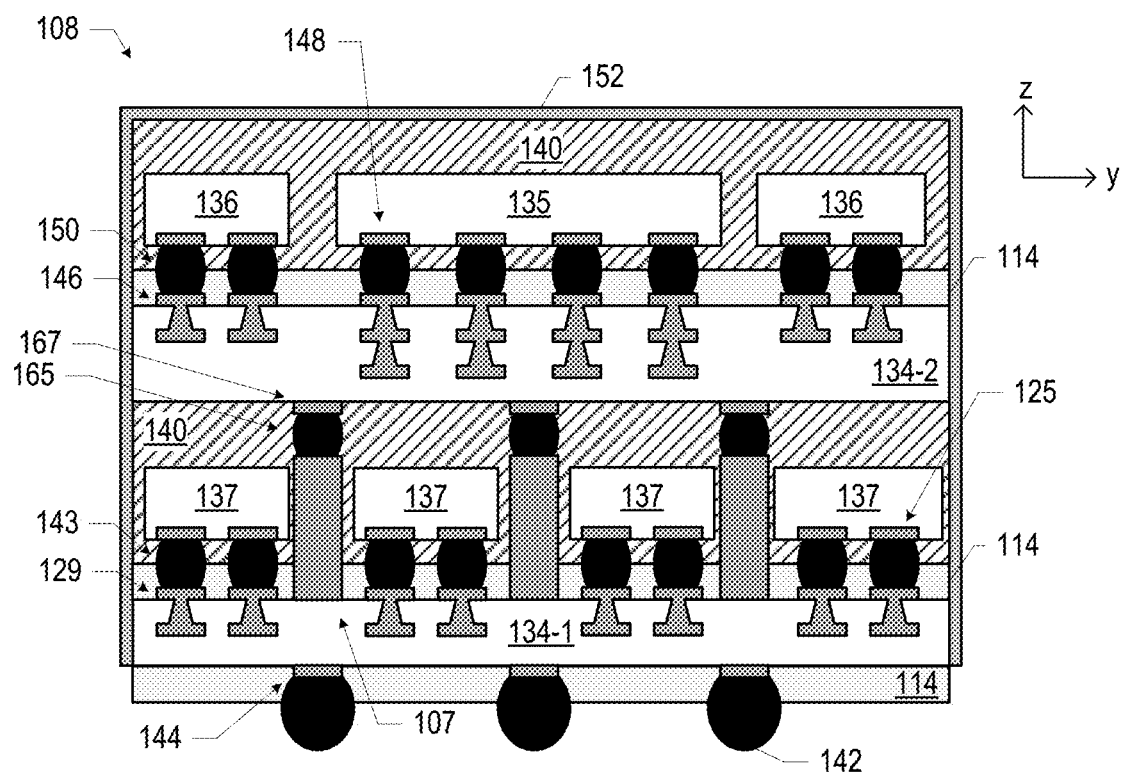

The package substrate 134 may include a dielectric material, and may have conductive pathways (e.g., including conductive vias and lines) extending through the dielectric material between the faces, or between different locations on each face. In some embodiments, the substrates 134 disclosed herein may include a lower-density substrate 134 (e.g., with laser-drilled vias disposed in a prepreg material) or a higher-density substrate 134 (e.g., with photolithographically defined vias disposed in a dielectric material, formed by redistribution layer (RDL) technology). In some embodiments, a substrate 134 disclosed herein may be a coreless or cored substrate. In some embodiments, a substrate 134 disclosed herein (or a substrate 133, as discussed below with) may include one or more redistribution layers. In some embodiments, a substrate 134 may include between two and four layers. In some embodiments, the package substrate 134 may have a thickness less than 1 millimeter (e.g., between 0.1 millimeters and 0.5 millimeters, or between 0.35 millimeters and 0.45 millimeters). Conductive contacts 144 may be disposed at the other face of the package substrate 134, and second-level interconnects 142 may couple these conductive contacts 144 to the antenna board 102 (not shown) in an antenna module 100. The second-level interconnects 142 illustrated in FIGS. 17A and 17B are solder balls (e.g., for a ball grid array arrangement), but any suitable second-level interconnects 142 may be used (e.g., pins in a pin grid array arrangement or lands in a land grid array arrangement). A solder resist 114 may be disposed around the conductive contacts 144. In some embodiments, a mold material 140 may be disposed around the logic die 135 and the components 136 (e.g., between the logic die 135, the components 136, and the package substrate 134 as an underfill material). In some embodiments, a thickness of the mold material may be less than 1 millimeter. Example materials that may be used for the mold material 140 include epoxy mold materials, as suitable; in some embodiments, the mold material 140 may have a desirable high thermal conductivity to improve thermal performance. In some embodiments, a conformal shield 152 may be disposed around the logic die 135, the components 136, and the package substrate 134 to provide electromagnetic shielding for the IC package 108. In some embodiments, a heat sink (not shown) may be disposed on any of the IC packages 108 disclosed herein.

The components 136 may include any suitable IC components. In some embodiments, one or more of the components 136 may include a die. In some embodiments, one or more of the components 136 may include a resistor, capacitor (e.g., decoupling capacitors), inductor, DC-DC converter circuitry, or other circuit elements. In some embodiments, the IC package 108 may be a system-in-package (SiP). In some embodiments, the IC package 108 may be a flip chip (FC) chip scale package (CSP). In some embodiments, the logic die 135 and/or one or more of the components 136 may include a memory device programmed with instructions to execute beam forming, scanning, and/or codebook functions.

FIG. 17B illustrates an example IC package 108 that may be included in an antenna module 100, in accordance with the embodiment of FIG. 1B. The IC package 108 may include a first package substrate 134-1 to which one or more RFFE dies 137 (and possibly other components, not shown but discussed below) may be coupled by first-level interconnects 143, and a second package substrate 134-2 to which a logic die 135 and one or more components 136 may be coupled by first-level interconnects 150. In particular, conductive contacts 129 at one face of the package substrate 134-1 may be coupled to conductive contacts 125 at faces of the RFFE dies 137 by first-level interconnects 143, and conductive contacts 146 at one face of the package substrate 134-2 may be coupled to conductive contacts 148 at faces of the logic die 135 and the components 136 by first-level interconnects 150. The first-level interconnects 143 and 150 illustrated in FIG. 17B are solder bumps, but any suitable first-level interconnects 150 may be used. A solder resist 114 may be disposed around the conductive contacts 146 and the conductive contacts 129. The package substrates 134-1 and 134-2 may include a dielectric material, and may have conductive pathways (e.g., including conductive vias and lines) extending through the dielectric material between the faces, or between different locations on each face. In some embodiments, the package substrates 134-1 and 134-2 may have a thickness less than 1 millimeter (e.g., between 0.1 millimeters and 0.5 millimeters). Conductive contacts 144 may be disposed at the other face of the package substrate 134-1, and second-level interconnects 142 may couple these conductive contacts 144 to the antenna board 102 (not shown) in an antenna module 100. A solder resist 114 may be disposed around the conductive contacts 144. In some embodiments, a mold material 140 may be disposed around the logic die 135 and the components 136 (e.g., between the logic die 135, the components 136, and the package substrate 134 as an underfill material) and/or around the RFFE dies 137. In some embodiments, the thickness of the mold material 140 on each of the package substrates 134 may be less than 1 millimeter. In some embodiments, a conformal shield 152 may be disposed around the IC package 108 of FIG. 17B to provide electromagnetic shielding.

In the IC package 108 of FIG. 17B, the package substrate 134-1 may be electrically coupled to the package substrate 134-2 by copper pillars 107 that extend from the top face of the package substrate 134-2 and electrically couple to conductive contacts 167 on the bottom face of the package substrate 134-2 with solder 165. In some embodiments, the conductive contacts 125 of the RFFE dies 137 may themselves be copper pillars (e.g., copper studs), coupled to the conductive contacts 129 by solder-based first-level interconnects 143. The copper pillars 107 may be located between various pairs of the RFFE dies 137, or may be positioned as suitable. During operation, an RFFE die 137 may communicate with the logic die 135 by an electrical pathway that includes the conductive contacts 125 (e.g., copper pillars), the first-level interconnects 143, the conductive contacts 129, electrical pathways in the substrate 134-1, the copper pillars 107, the solder 165, the conductive contacts 167, electrical pathways in the substrate 134-2, the conductive contacts 146, the first-level interconnects 150, and the conductive contacts 148 of the logic die 135. The IC package 108 may be an example of a stacked package, one including multiple vertically arranged substrates 134. In any of the embodiments disclosed herein that include copper pillars 107, the copper pillars 107 may be replaced with plated vias as appropriate (e.g., when using embedded die manufacturing technology).

Figure 18:
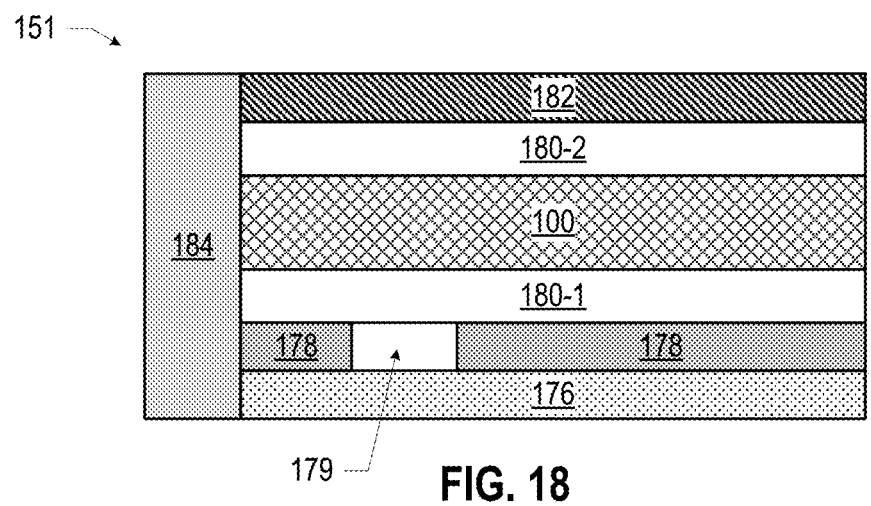
FIG. 18 is a side, cross-sectional view of a portion of a communication device including an antenna module, in accordance with various embodiments.

The antenna modules 100 disclosed herein may be included in any suitable communication device (e.g., a computing device with wireless communication capability, a wearable device with wireless communication circuitry, etc.). FIG. 18 is a side, cross-sectional view of a portion of a communication device 151 including an antenna module 100, in accordance with various embodiments. In particular, the communication device 151 illustrated in FIG. 18 may be a handheld communication device, such as a smart phone or tablet. The communication device 151 may include a glass or plastic back cover 176 proximate to a metallic or plastic chassis 178. In some embodiments, the chassis 178 may be laminated onto the back cover 176, or attached to the back cover 176 with an adhesive. The chassis 178 may include one or more openings 179 that align with antenna patches 104 (not shown) in the antenna module 100 to improve performance. An air gap 180-1 may space at least some of the antenna module 100 from the chassis 178, and another air gap 180-2 may be located on the other side of the antenna module 100. In some embodiments, the spacing between the antenna patches 104 and the back cover 176 may be selected and controlled within tens of microns to achieve desired performance. The air gap 180-2 may separate the antenna module 100 from a display 182 on the front side of the communication device 151; in some embodiments, the display 182 may have a metal layer proximate to the air gap 180-2 to draw heat away from the display 182. A metal or plastic housing 184 may provide the "sides" of the communication device 151.

The antenna modules 100 disclosed herein may be secured in a communication device in any desired manner. A number of the embodiments discussed below refer to fixtures that secure an antenna module 100 (or an antenna board 102, for ease of illustration) to the chassis 178 of a communication device, but any of the fixtures discussed below may be used to secure an antenna module 100 to any suitable portion of a communication device.

Figure 19:
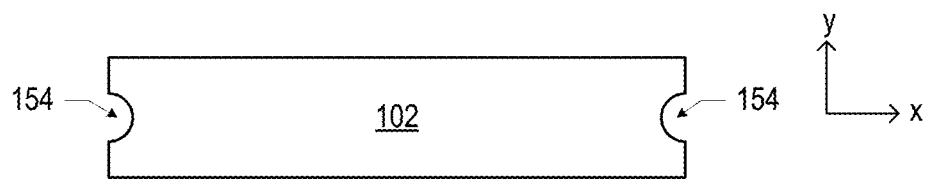
FIG. 19 is a top view of an example antenna board, in accordance with various embodiments.
Figure 20:
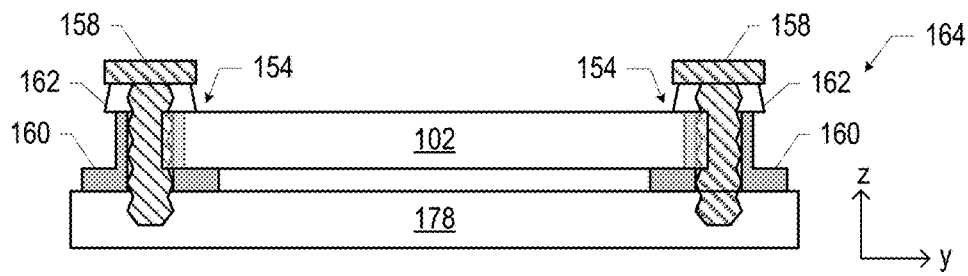
FIG. 20 is a side, cross-sectional view of the antenna board of FIG. 19 coupled to an antenna board fixture, in accordance with various embodiments.

In some embodiments, an antenna board 102 may include cutouts that may be used to secure the antenna board 102 to a chassis 178. For example, FIG. 19 is a top view of an example antenna board 102 including two cutouts 154 at either longitudinal end of the antenna board 102. The antenna board 102 of FIG. 19 may be part of an antenna module 100, but only the antenna board 102 is depicted in FIG. 19 for ease of illustration. FIG. 20 is a side, cross-sectional view of the antenna board 102 of FIG. 19 coupled to an antenna board fixture 164, in accordance with various embodiments. In particular, the antenna board fixture 164 of FIG. 20 may include two assemblies at either longitudinal end of the antenna board 102. Each assembly may include a boss 160 (on or part of the chassis 178), a spacer 162 on the top surface of the boss 160, and a screw 158 that extends through a hole in the spacer 162 and screws into threads in the boss 160. The antenna board 102 may be clamped between the spacer 162 and the top of the boss 160 by the tightened screw 158; the boss 160 may be at least partially set in the proximate cutout 154. In some embodiments, the outer dimensions of the antenna board 102 of FIG. 19 may be approximately 5 millimeters by approximately 38 millimeters.

In some embodiments, the screws 158 disclosed herein may be used to dissipate heat generated by the antenna module 100 during operation. In particular, in some embodiments, the screws 158 may be formed of metal, and the boss 160 and the chassis 178 may also be metallic (or may otherwise have a high thermal conductivity); during operation, heat generated by the antenna module 100 may travel away from the antenna module 100 through the screws 158 and into the chassis 178, mitigating or preventing an over-temperature condition. In some embodiments, a thermal interface material (TIM), such as a thermal grease, may be present between the antenna board 102 and the screws 158/boss 160 to improve thermal conductivity.

In some embodiments, the screws 158 disclosed herein may be used as additional antennas for the antenna module 100. In some such embodiments, the boss 160 (and other materials with which the screws 158 come into contact) may be formed of plastic, ceramic, or another non-conducting material. The shape and location of the screws 158 may be selected so that the screws 158 act as antenna patches 104 for the antenna board 102.

Figure 21:
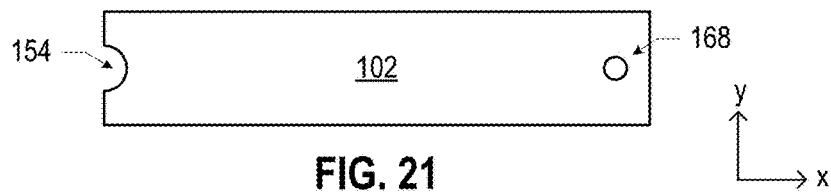
FIG. 21 is a top view of an example antenna board, in accordance with various embodiments.
Figure 22:
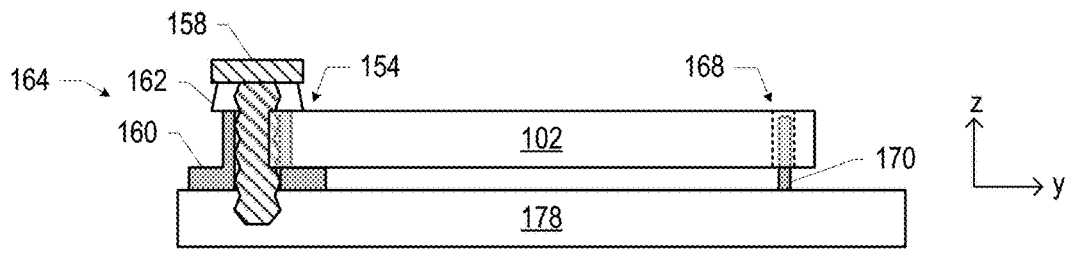
FIG. 22 is a side, cross-sectional view of the antenna board of FIG. 21 coupled to an antenna board fixture, in accordance with various embodiments.

An antenna board 102 may include other arrangements of cutouts. For example, FIG. 21 is a top view of an example antenna board 102 including a cutout 154 at one longitudinal end and a hole 168 proximate to the other longitudinal end. The antenna board 102 of FIG. 21 may be part of an antenna module 100, but only the antenna board 102 is depicted in FIG. 21 for ease of illustration. FIG. 22 is a side, cross-sectional view of the antenna board 102 of FIG. 21 coupled to an antenna board fixture 164, in accordance with various embodiments. In particular, the antenna board fixture 164 of FIG. 22 may include two assemblies at either longitudinal end of the antenna board 102. The assembly proximate to the cutout 154 may include the boss 160/spacer 162/screw 158 arrangement discussed above with reference to FIG. 20. The assembly proximate to the hole 168 may include a pin 170 extending from the chassis 178. The antenna board 102 may be clamped between the spacer 162 and the top of the boss 160 by the tightened screw 158 at one longitudinal end (the boss 160 may be at least partially set in the proximate cutout 154), and the other longitudinal end may be prevented from moving in the x-y plane by the pin 170 in the hole 168.

Figure 23A:
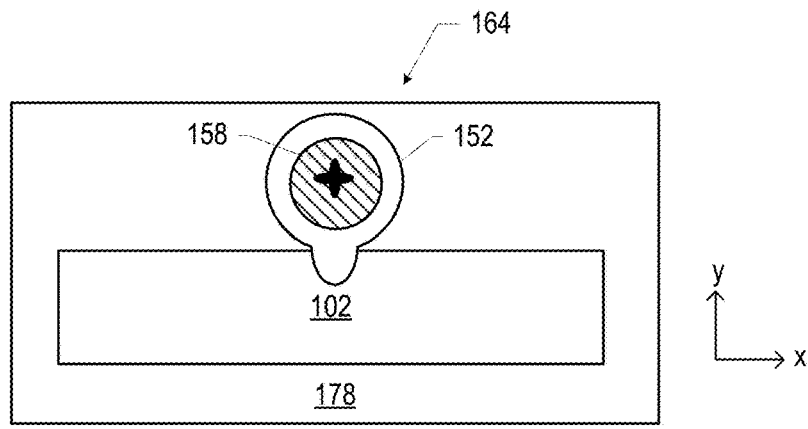
FIGS. 23A and 23B are a top view and a side, cross-sectional view, respectively, of an antenna board coupled to an antenna board fixture, in accordance with various embodiments.
Figure 23B:
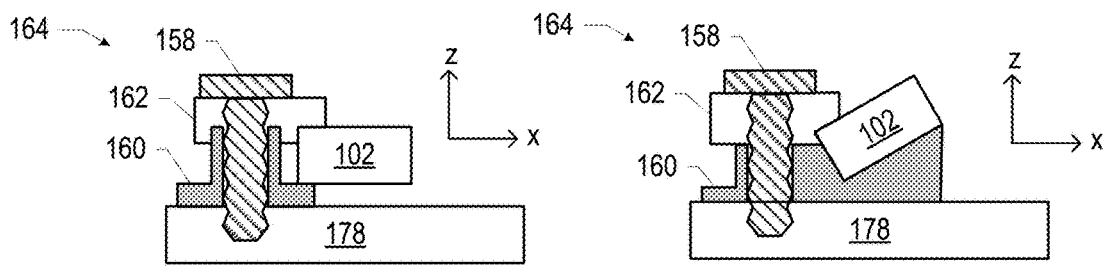

In some embodiments, an antenna module 100 may be secured to a communication device at one or more locations along the length of the antenna board 102, in addition to or instead of at the longitudinal ends of the antenna board 102. For example, FIGS. 23A and 23B are a top view and a side, cross-sectional view, respectively, of an antenna board 102 coupled to an antenna board fixture 164, in accordance with various embodiments. The antenna board 102 of FIG. 23 may be part of an antenna module 100, but only the antenna board 102 is depicted in FIG. 23 for ease of illustration. In the antenna board fixture 164 of FIG. 23, a boss 160 (one or part of the chassis 178), a spacer 162 on the top surface of the boss 160, and a screw 158 that extends through a hole in the spacer 162 and screws into threads in the boss 160. The exterior of the boss 160 of FIG. 23 may have a square cross-section, and the spacer 162 may have a square cavity on its lower surface so as to partially wrap around the boss 160 while being prevented from rotating around the boss 160. The antenna board 102 may be clamped between the spacer 162 and the top of the boss 160 by the tightened screw 158. In some embodiments, the antenna board 102 may not have a cutout 154 along its longitudinal length (as shown); while in other embodiments, the antenna board 102 may have one or more cutouts 154 along its long edges.

Figure 24:
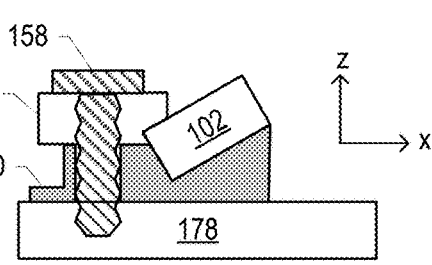
FIG. 24 is a side, cross-sectional view of an antenna board coupled to an antenna board fixture, in accordance with various embodiments.

In some embodiments, an antenna module 100 may be secured to a surface in a communication device so that the antenna module 100 (e.g., an array of antenna patches 104 in the antenna module) is not parallel to the surface. Generally, the antenna patches 104 may be positioned at any desired angle relative to the chassis 178 or other elements of a communication device. FIG. 24 illustrates an antenna board fixture 164 in which the antenna board 102 may be held at an angle relative to the underlying surface of the chassis 178. The antenna board 102 of FIG. 24 may be part of an antenna module 100, but only the antenna board 102 is depicted in FIG. 24 for ease of illustration. The antenna board fixture 164 may be similar to the antenna board fixtures of FIGS. 20, 22, and 23, but may include a boss 160 having an angled portion on which the antenna board 102 may rest. When the screw 158 is tightened, the antenna board 102 may be held at a desired angle relative to the chassis 178.

The antenna boards 102, IC packages 108, and other elements disclosed herein may be arranged in any suitable manner in an antenna module 100. For example, an antenna module 100 may include one or more connectors 105 for transmitting signals into and out of the antenna module 100. FIGS. 25-28 are exploded, perspective views of example antenna modules 100, in accordance with various embodiments. Any of the antenna modules 100 of FIGS. 25-28 may include RFFE dies 137 in the antenna board 102 (e.g., in accordance with FIG. 1A) or in the IC package 108 (e.g., in accordance with FIG. 1B).

Figure 25:
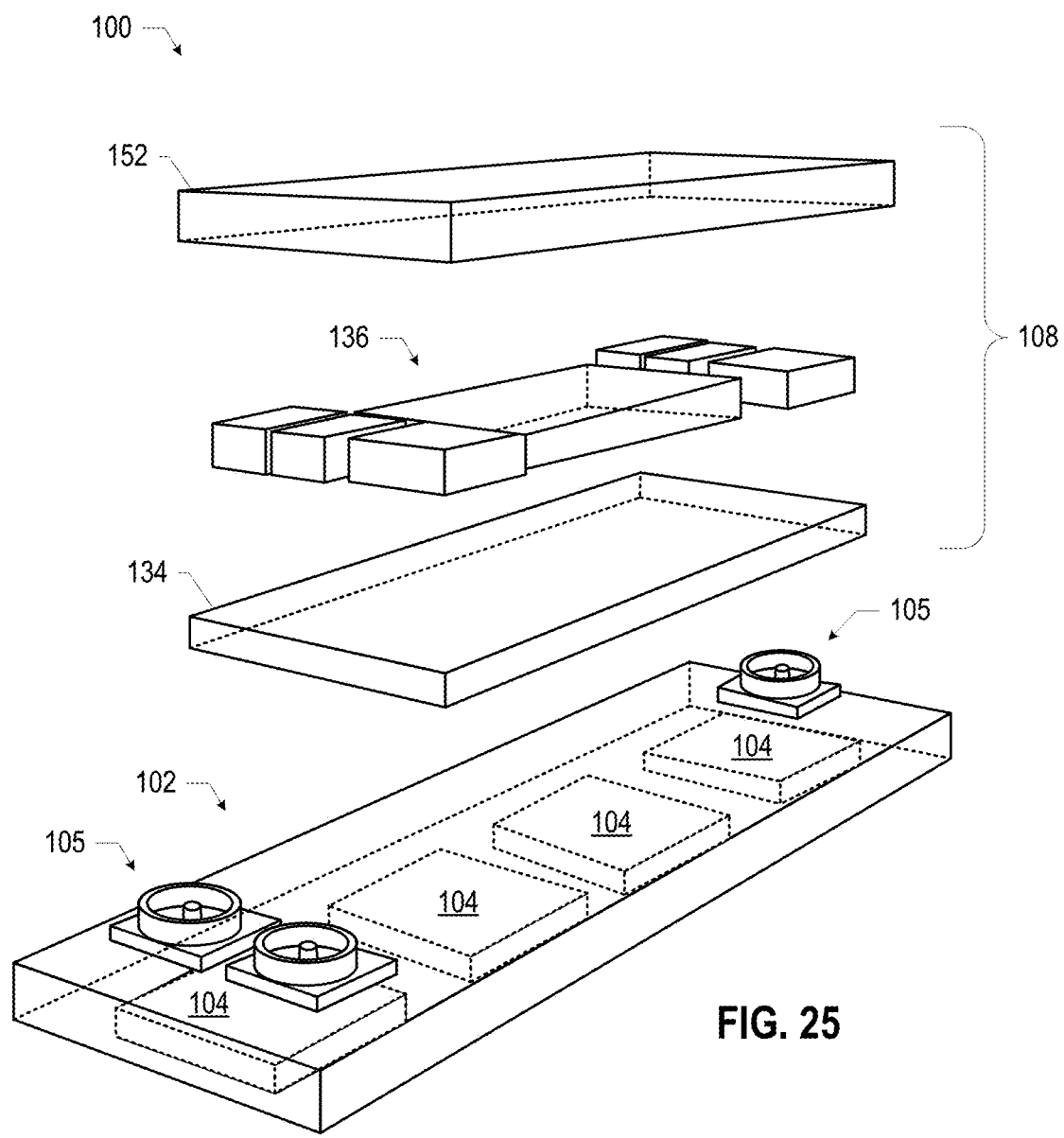
FIGS. 25-28 are exploded, perspective views of example antenna modules, in accordance with various embodiments.

In the embodiment of FIG. 25, an antenna board 102 includes four antenna patches 104. These antenna patches 104 may be arranged in the antenna board 102 in accordance with any of the embodiments disclosed herein (e.g., with air cavities 130/132, rotated relative to the axis of the array, on a bridge structure 124, etc.). One or more connectors 105 may be disposed on the antenna board 102; these connectors 105 may be coaxial cable connectors, as shown, or any other connectors (e.g., the flat cable connectors discussed below with reference to FIGS. 29 and 30). The connectors 105 may be suitable for transmitting RF signals, for example. The IC package 108 may include a package substrate 134, one or more components 136 coupled to the package substrate 134, and a conformal shield 152 over the components 136 and the package substrate 134. In some embodiments, the four antenna patches 104 may provide a 1×4 array for 28/39 gigahertz communication, and a 1×8 array of 60 gigahertz dipoles.

Figure 26:
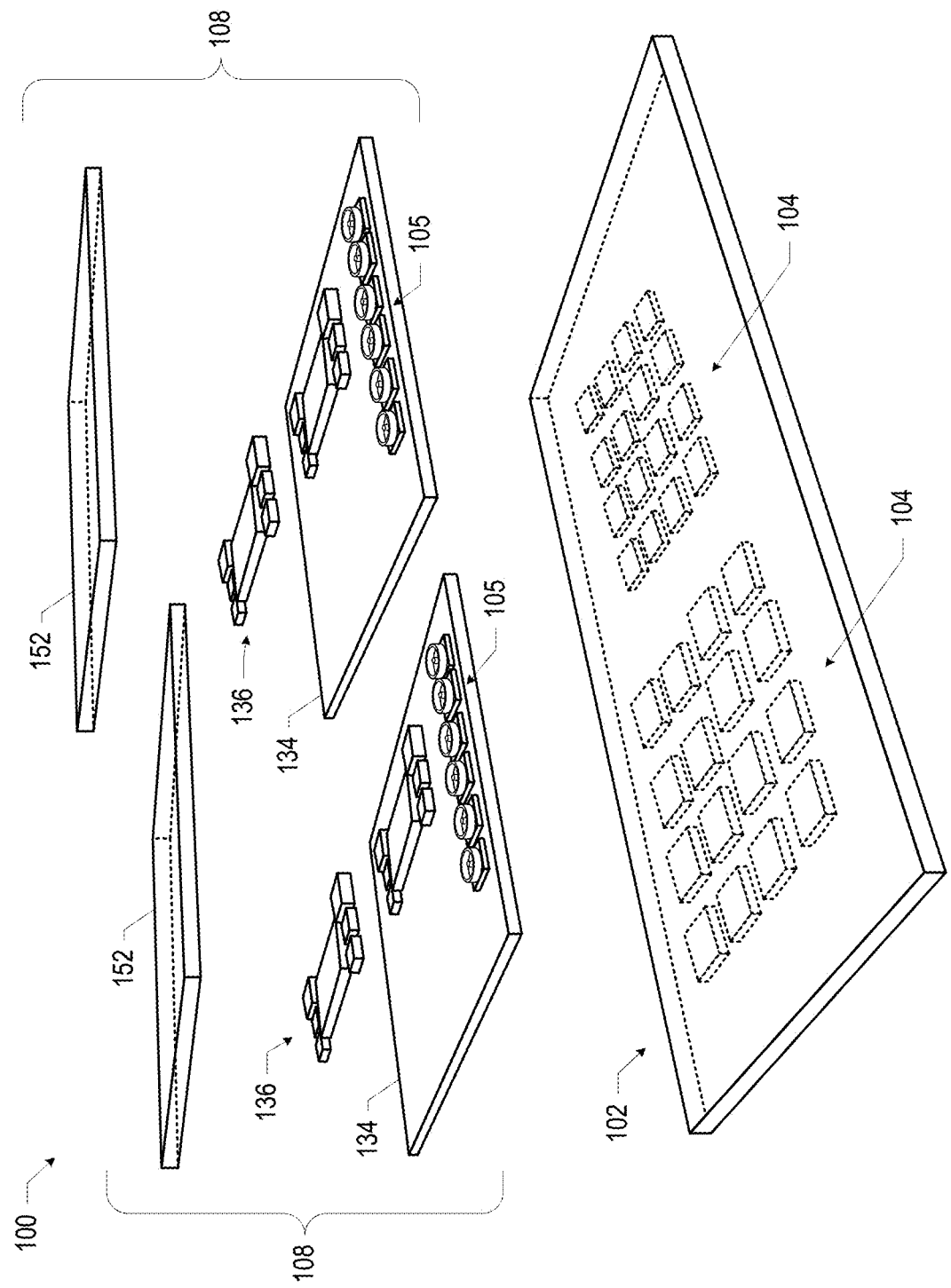

In the embodiment of FIG. 26, an antenna board 102 includes two sets of sixteen antenna patches 104, each set arranged in a 4×4 array. These antenna patches 104 may be arranged in the antenna board 102 in accordance with any of the embodiments disclosed herein (e.g., with air cavities 130/132, rotated relative to the axis of the array, on a bridge structure 124, etc.). The antenna module 100 of FIG. 26 includes two IC packages 108; one IC package 108 associated with (and disposed over) one set of antenna patches 104, and the other IC package 108 associated with (and disposed over) the other set of antenna patches 104. In some embodiments, one set of antenna patches 104 may support 28 gigahertz communications, and the other set of antenna patches 104 may support 39 gigahertz communications. The IC package 108 may include a package substrate 134, one or more components 136 coupled to the package substrate 134, and a conformal shield 152 over the components 136 and the package substrate 134. One or more connectors 105 may be disposed on the package substrate 134; these connectors 105 may be coaxial cable connectors, as shown, or any other connectors (e.g., the flat cable connectors discussed below with reference to FIGS. 29 and 30). The conformal shields 152 may not extend over the connectors 105. In some embodiments, the antenna module 100 of FIG. 26 may be suitable for use in routers and customer premises equipment (CPE). In some embodiments, the outer dimensions of the antenna board 102 may be approximately 22 millimeters by approximately 40 millimeters.

Figure 27:
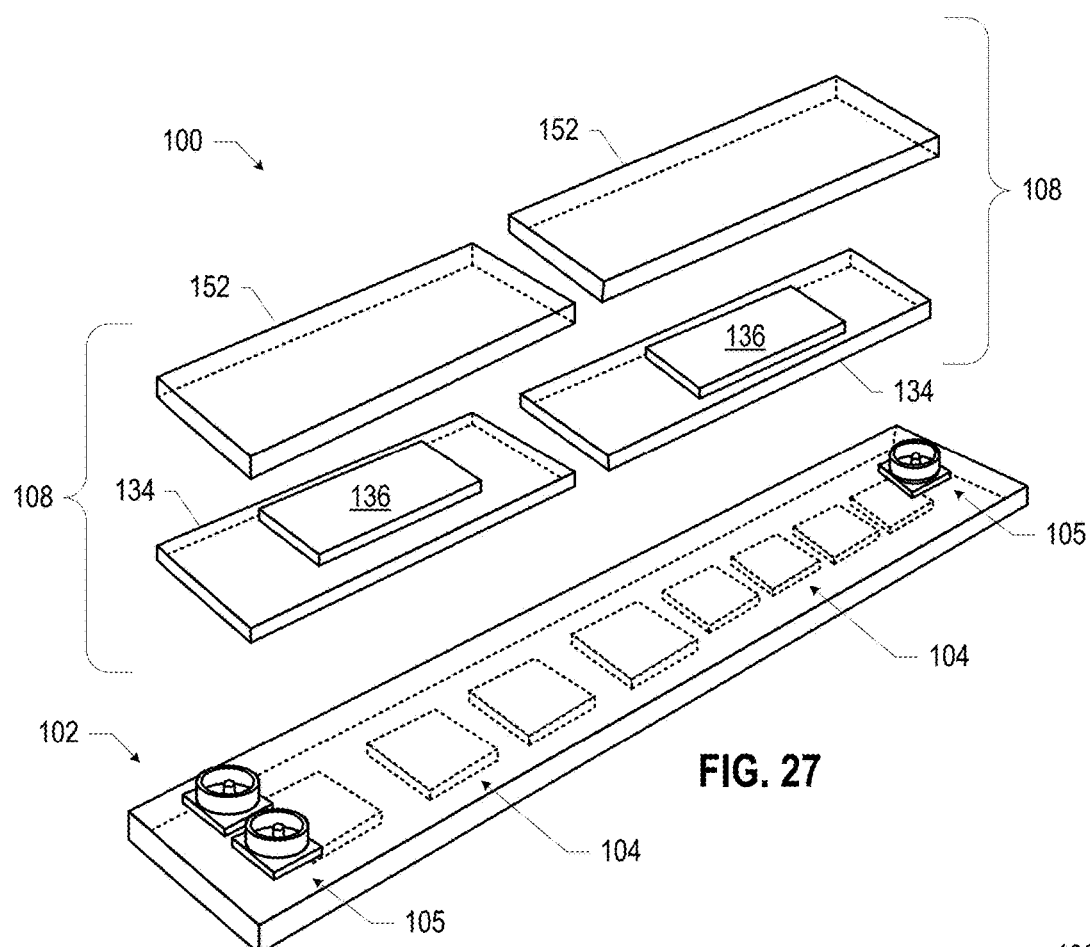

In the embodiment of FIG. 27, an antenna board 102 includes two sets of four antenna patches 104, each set arranged in a 1×4 array. In some embodiments, one set of antenna patches 104 may support 28 gigahertz communications, and the other set of antenna patches 104 may support 39 gigahertz communications. These antenna patches 104 may be arranged in the antenna board 102 in accordance with any of the embodiments disclosed herein (e.g., with air cavities 130/132, rotated relative to the axis of the array, on a bridge structure 124, etc.). One or more connectors 105 may be disposed on the antenna board 102; these connectors 105 may be coaxial cable connectors, as shown, or any other connectors (e.g., the flat cable connectors discussed below with reference to FIGS. 29 and 30). The antenna module 100 of FIG. 27 includes two IC packages 108; one IC package 108 associated with (and disposed over) one set of antenna patches 104, and the other IC package 108 associated with (and disposed over) the other set of antenna patches 104. The IC package 108 may include a package substrate 134, one or more components 136 coupled to the package substrate 134, and a conformal shield 152 over the components 136 and the package substrate 134. In some embodiments, the outer dimensions of the antenna board 102 may be approximately 5 millimeters by approximately 32 millimeters.

Figure 28:
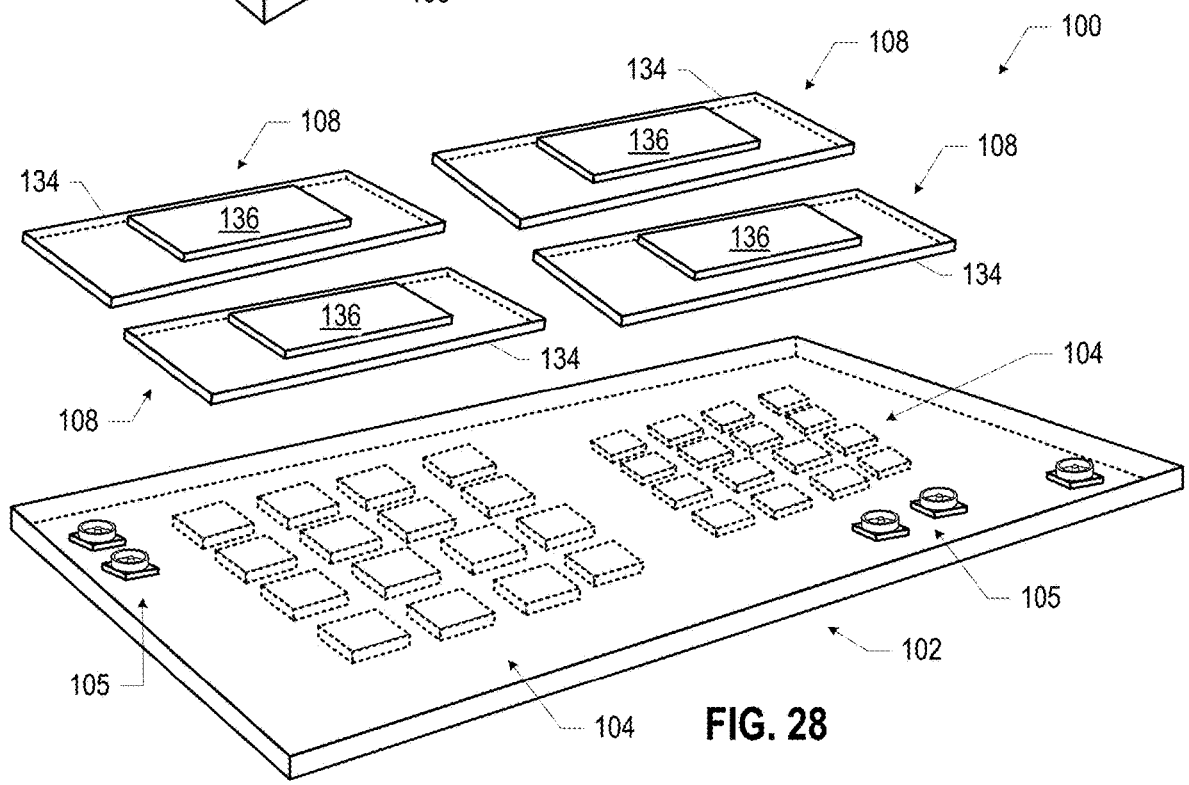

In the embodiment of FIG. 28, an antenna board 102 includes two sets of sixteen antenna patches 104, each set arranged in a 4×4 array. These antenna patches 104 may be arranged in the antenna board 102 in accordance with any of the embodiments disclosed herein (e.g., with air cavities 130/132, rotated relative to the axis of the array, on a bridge structure 124, etc.). The antenna module 100 of FIG. 28 includes four IC packages 108; two IC packages 108 associated with (and disposed over) one set of antenna patches 104, and the other two IC packages 108 associated with (and disposed over) the other set of antenna patches 104. The IC package 108 may include a package substrate 134, one or more components 136 coupled to the package substrate 134, and a conformal shield (not shown) over the components 136 and the package substrate 134. One or more connectors 105 may be disposed on the antenna board 102; these connectors 105 may be coaxial cable connectors, as shown, or any other connectors (e.g., the flat cable connectors discussed below with reference to FIGS. 29 and 30).

Figure 29:
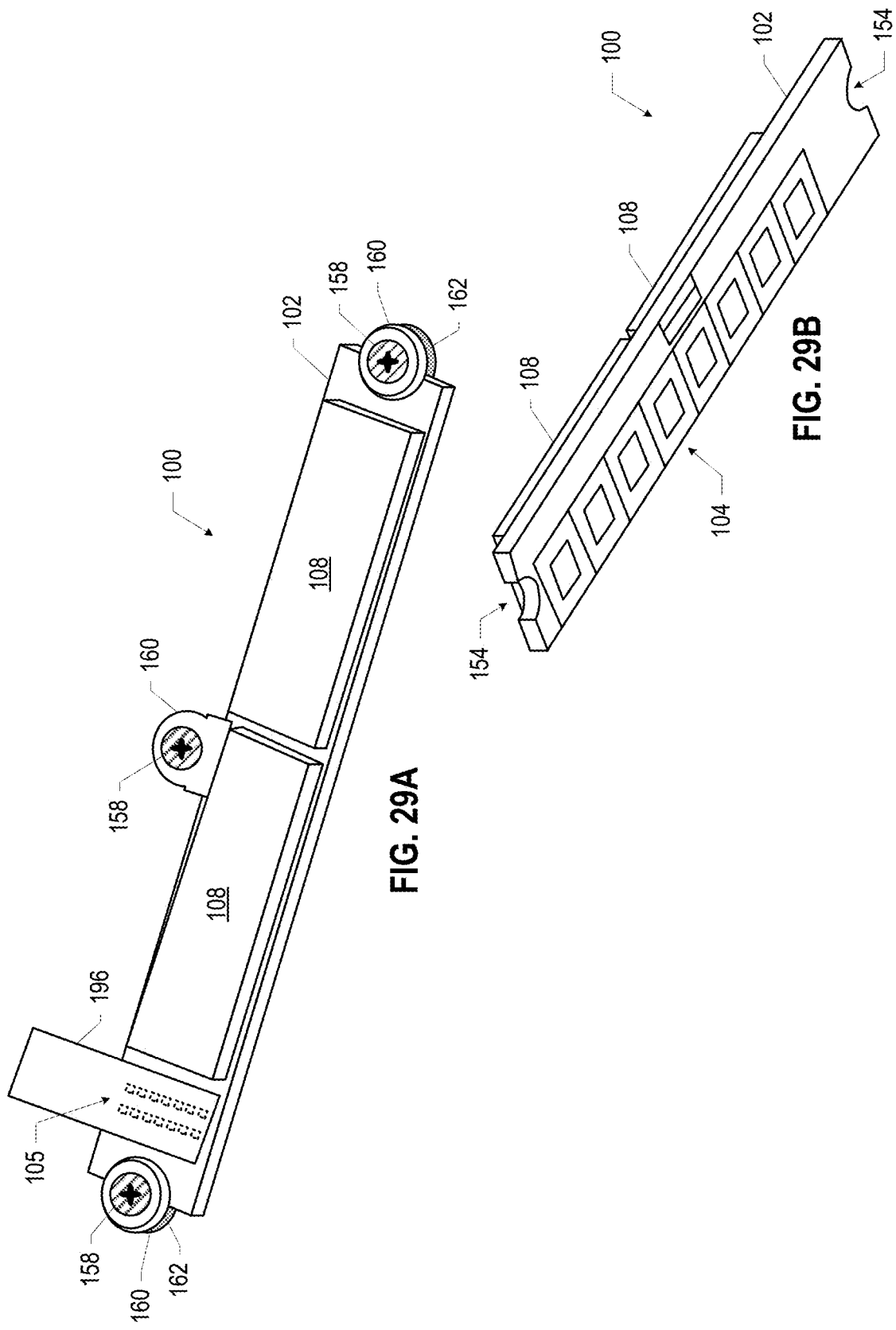
FIGS. 29A and 29B are top and bottom perspective views, respectively, of an example antenna module, in accordance with various embodiments.

FIGS. 29A and 29B are top and bottom perspective views, respectively, of another example antenna module 100, in accordance with various embodiments. In the embodiment of FIG. 29, an antenna board 102 includes two sets of four antenna patches 104, each set arranged in a 1×4 array. These antenna patches 104 may be arranged in the antenna board 102 in accordance with any of the embodiments disclosed herein (e.g., with air cavities 130/132, rotated relative to the axis of the array, on a bridge structure 124, etc.). One or more connectors 105 may be disposed on the antenna board 102; these connectors 105 may be flat cable connectors (e.g., flexible printed circuit (FPC) cable connectors) to which a flat cable 196 may be coupled. The antenna module 100 of FIG. 27 includes two IC packages 108; one IC package 108 associated with (and disposed over) one set of antenna patches 104, and the other IC package 108 associated with (and disposed over) the other set of antenna patches 104. The antenna module 100 of FIG. 27 may also include cutouts 154 at either longitudinal end; FIG. 29A illustrates the antenna module 100 secured by the antenna board fixtures 164 of FIG. 20 (at either longitudinal end) and by the antenna board fixture 164 of FIG. 23 (in the middle). In some embodiments, the antenna patches 104 of the antenna module 100 of FIG. 29 may use the proximate edges of the antenna board 102 for vertical and horizontal polarized edge fire antennas; in such an embodiment, the conformal shield 152 of the IC packages 108 may act as a reference. More generally, the antenna patches 104 disclosed herein may be used for broadside or edge fire applications, as appropriate.

Figure 30:
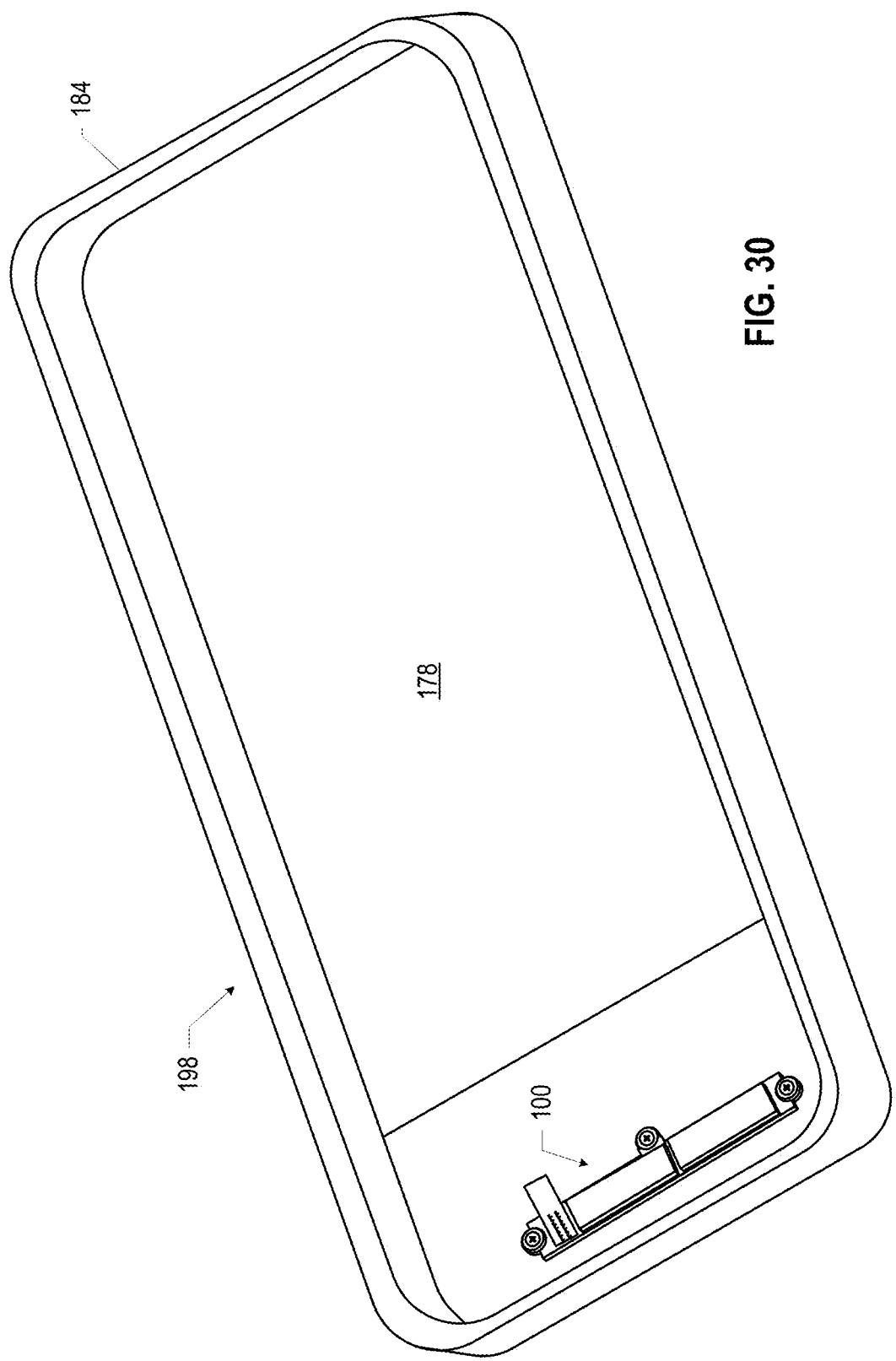
FIG. 30 is a perspective view of a handheld communication device including an antenna module, in accordance with various embodiments.

Any suitable communication device may include one or more of the antenna modules 100 disclosed herein. For example, FIG. 30 is a perspective view of a handheld communication device 198 including an antenna module 100, in accordance with various embodiments. In particular, FIG. 30 depicts the antenna module 100 (and associated antenna board fixtures 164) of FIG. 29 coupled to a chassis 178 of the handheld communication device 198 (which may be the communication device 151 of FIG. 18). In some embodiments, the handheld communication device 198 may be a smart phone.

FIG. 31 is a perspective view of a laptop communication device 190 including multiple antenna modules 100, in accordance with various embodiments. In particular, FIG. 30 depicts an antenna module 100 having four antenna patches 104 at either side of the keyboard of a laptop communication device 190. The antenna patches 104 may occupy an area on the outside housing of the laptop communication device 190 that is approximately equal to or less than the area required for two adjacent Universal Serial Bus (USB) connectors (i.e., approximately 5 millimeters (height) by 22 millimeters (width) by 2.2 millimeters (depth)). The antenna module 100 of FIG. 31 may be tuned for operation in the housing (e.g., ABS plastic) of the device 190. In some embodiments, the antenna modules 100 in the device 190 may be tilted at a desired angle relative to the housing of the device 190.

An antenna module 100 included in a communication device (e.g., fixed wireless access devices) may include an antenna array having any desired number of antenna patches 104 (e.g., 4×8 antenna patches 104).

Any of the antenna modules 100 disclosed herein may include antenna boards 102 that have one or more narrowed portions that act as hinge(s) to allow the antenna module 100 to bend so that different sections of the antenna boards 102 are non-coplanar with each other. For example, FIGS. 32A and 32B illustrate antenna modules 100 having multiple IC packages 108 disposed on an antenna board 102 (e.g., in accordance with any of the embodiments disclosed herein). The antenna board 102 includes an antenna patch support 110 on which multiple antenna patches 104 are disposed (e.g., in accordance with any of the embodiments disclosed herein) and which includes a narrowed portion 111. The material of the narrowed portion 111 may have adequate flexibility to allow the antenna patch support 110 to bend at the narrowed portion (e.g., from an initial configuration as shown in FIG. 32A to a bent configuration as shown in FIG. 32B) to a desired angle without significant damage to the antenna board 110. The antenna module 100 may be mounted in an electronic component (e.g., in the communication device 151) in its bent configuration (e.g., using any of the fixtures discussed above with reference to FIGS. 19-24 and 29-30), allowing the antenna patches 104 on different sections of the antenna board 102 to radiate and receive at different angles, thereby increasing the range of coverage of the array of antenna patches 104 relative to an embodiment in which the antenna patches 104 are all mounted on a single plane of an antenna patch support 110.

In some embodiments, the narrowed portion 111 may be formed by sawing or otherwise cutting through an initial antenna patch support 110 until the desired thickness of the narrowed portion 111 is reached; in other embodiments, the antenna patch support 110 may be fabricated with the narrowed portion 111 without any sawing or cutting required. Although FIGS. 32A and 32B. illustrate a particular number of IC packages 180 and antenna patches 104, this is simply for illustrative purposes, and any of the antenna boards 102 or antenna modules 100 disclosed herein may include one or more narrowed portions 111 to allow multiple sections of the antenna board 102 to be oriented at different angles.

Although various ones of the accompanying drawings have illustrated the antenna board 102 as having a larger footprint than the IC package 108, the antenna board 102 and the IC package 108 (which may be, e.g., an SiP) may have any suitable relative dimensions. For example, in some embodiments, the footprint of the IC package 108 in an antenna module 100 may be larger than the footprint of the antenna board 102. Such embodiments may occur, for example, when the IC package 108 includes multiple dies as the components 136. FIGS. 33-36 illustrate various examples of antenna modules 100 in which the footprint of the IC package 108 is larger than the footprint of an antenna board 100.

Figure 33:
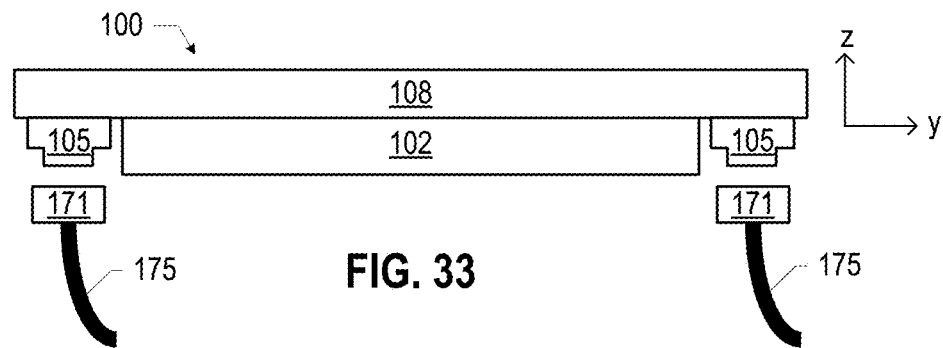
FIGS. 33-36 are side, cross-sectional views of example antenna modules, in accordance with various embodiments.

In the embodiment illustrated in FIG. 33, the face of the IC package 108 to which the antenna board is attached may also have multiple connectors 105 disposed thereon. These connectors 105 may extend past side faces of the antenna board 102, and may enable direct connection to the IC package 108 by cables 175 having connectors 171 that mate with the connectors 105. The connectors 105 of FIGS. 33-36 may take any suitable form (e.g., coaxial cable connectors, the flat cable connectors discussed below with reference to FIGS. 29 and 30, any of the other forms disclosed herein, etc.).

Figure 34:
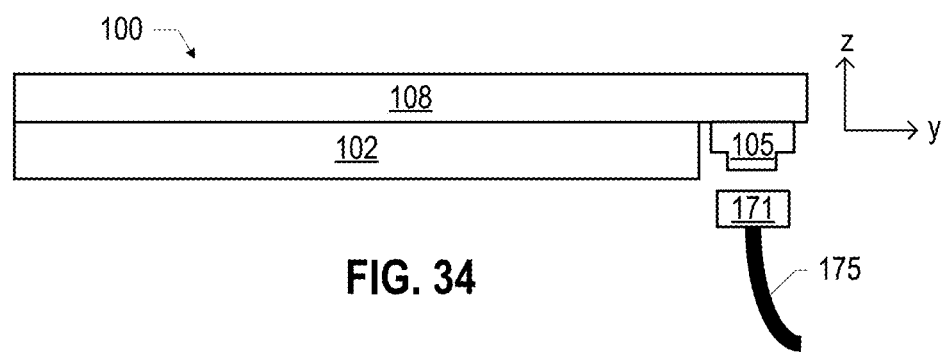

In the embodiment illustrated in FIG. 34, the antenna module 100 may have an asymmetric arrangement of the antenna board 102 and a connector 105. Generally, an antenna module 100 may include any suitable arrangement of connectors 105 on the IC package 108 and/or the antenna board 102 (as discussed above).

Figure 35:
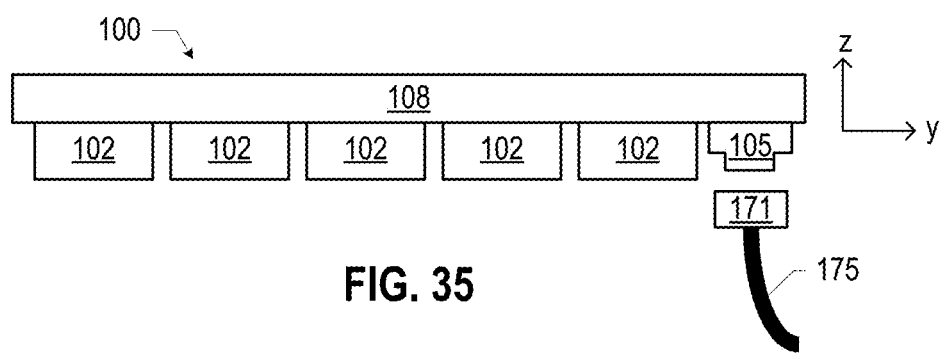

In some embodiments, an antenna module 100 may include multiple antenna boards 102. For example, FIG. 35 illustrates an embodiment in which multiple antenna boards 102 are coupled to a single IC package 108. FIG. 35 also illustrates a connector 105 on the bottom face of the IC package 108, but embodiments in which multiple antenna boards 102 are coupled to a single IC package 108 may include no connectors 105 on the IC package 108, or one or more connectors 105 on the IC package 108.

Figure 36:
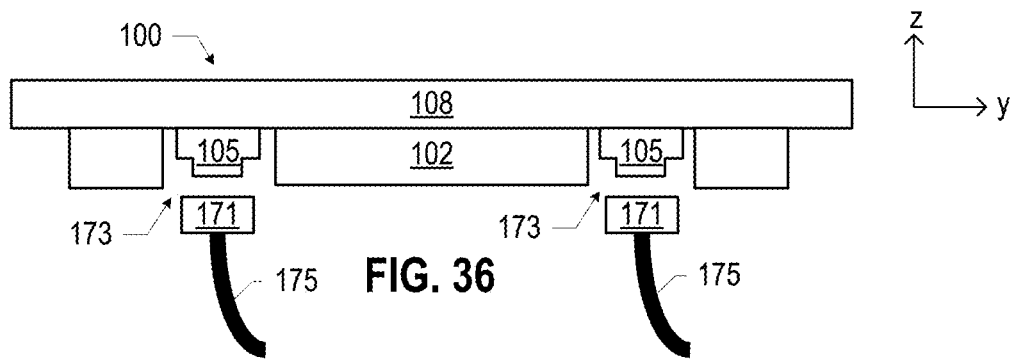

In some embodiments, an antenna board 102 may include holes through which connectors 105 on a face of the IC package 108 may be exposed, and cables 175 may couple to these connectors. For example, FIG. 36 illustrates an embodiment in which an antenna board 102 has one or more holes 173 therein; connectors 105 coupled to the bottom face of the IC package 108 may extend into the holes 173 (e.g., to couple with cables 175 with mating connectors 171). Although FIG. 36 illustrates an antenna module in which the antenna board 102 has a smaller footprint than the IC package 108, any of the antenna boards 102 disclosed herein may include holes 173 through which connectors 105 coupled to the IC package 108 may extend (e.g., antenna boards 102 having footprints that are larger than an IC package 108).

As noted above, an RFFE die 137 may include front-end circuitry for RF communications. FIG. 37 illustrates example circuitry that may be included in an RFFE die 137, in accordance with various embodiments. In particular, FIG. 37 illustrates a vertical antenna circuit 169-1 and a horizontal antenna circuit 169-2. Each circuit 169 includes a switch 181 (e.g., a single-pole, three-throw switch) whose input may be controllably connected to one or two PAs 186 or an LNA 188, which are in turn connected to a switch 192 (e.g., a single-pole, three-throw switch). The output of the switch 192 of the circuit 169-1 is the vertical antenna signal (ANT_V) and the output of the switch 192 of the circuit 169-2 is the horizontal antenna signal (ANT_H) for provision to one or more antenna patches 104 (not shown). The circuits 169 are coupled by a loopback switch 194 to which loopback control may be applied. In some embodiments, the switches 181 may be replaced by single-pole, four-throw switches that may be coupled to band-specific LNAs. The circuitry of FIG. 37 is simply an example of circuitry that may be included in an RFFE die 137. In some embodiments, the circuitry of FIG. 37 may be divided between multiple RFFE dies 137; for example, one RFFE die 137 may include PAs, and another RFFE die 137 may include LNAs, and these two RFFE dies 137 may be electrically coupled (e.g., through a substrate 134-1, as discussed above with reference to FIG. 17B, or through a substrate 133, as discussed below). In some embodiments, an RFFE die 137 including the circuitry of FIG. 37 may support a full band of operation from 24.25 gigahertz to 43.5 gigahertz, and may power a dual polarity broadband antenna or co-located quad fed antenna. In some embodiments, an RFFE die 137 may provide power control, power detection, and calibration for an associated antenna patch 104. In some embodiments, an RFFE die 137 may have a single output for broadband antenna support.

Figure 38:
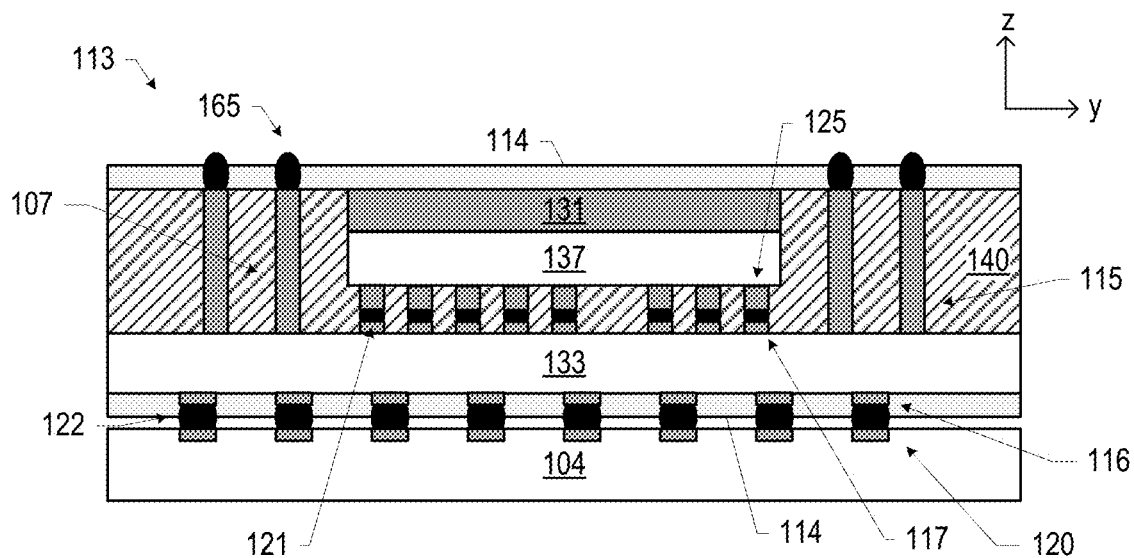
FIG. 38 is a side, cross-sectional view of an active antenna assembly that may be included in an antenna module, in accordance with various embodiments.

FIG. 38 is a side, cross-sectional view of an active antenna assembly 113 that may be included in an antenna module 100, in accordance with various embodiments. For example, one or more active antenna assemblies 113 may be coupled to an IC package 108 (e.g., as illustrated in FIG. 35), and each of the active antenna assemblies 113 may serve as an antenna board 102. In other embodiments, one or more active antenna assemblies 113 may be coupled to an antenna patch support 110 (e.g., over a cavity 130 in an antenna patch support 110 and/or on either side of a cavity 130, as discussed above), and the active antenna assemblies 113/antenna patch support 110 may together serve as an antenna board 102.

In FIG. 38, the active antenna assembly 113 may include a substrate 133 to which one or more RFFE dies 137 (and possibly other components, not shown but discussed below) may be coupled by solder 121. In particular, conductive contacts 117 at one face of the substrate 133 may be coupled to conductive contacts 125 (e.g., copper pillars or bumps) at a face of the RFFE die 137 by solder 121. The substrate 133 may include a dielectric material, and may have conductive pathways (e.g., including conductive vias and lines) extending through the dielectric material between the faces, or between different locations on each face; the substrate 133 may be a lower-density substrate or a higher-density substrate, as discussed above, in various embodiments. In some embodiments, a mold material 140 may be disposed around the RFFE die 137. For example, in some embodiments, the substrate 133 may be a coreless substrate having between two and four layers.

The substrate 133 may be electrically coupled to a top face of the active antenna assembly 113 by copper pillars 107 that extend from the top face of the substrate 133; solder 165 may be disposed on the tops of the copper pillars 107 to electrically couple the copper pillars 107 to other components (e.g., other layers in an antenna patch support 110, or to an IC package 108, not shown). During operation, an RFFE die 137 may communicate with other components (not shown) by an electrical pathway that includes the conductive contacts 125, the solder 121, the conductive contacts 117, electrical pathways in the substrate 133, the copper pillars 107, and the solder 165. In some embodiments, the pitch of the copper pillars 107 may be 200 microns or larger. In some embodiments, further shielding (e.g., a conformal metal layer, not shown) may be disposed on side faces of the RFFE assembly 113.

In some embodiments, the active antenna assembly 113 may include a ring 115 (e.g., having a rectangular or round footprint) of copper pillars 107 proximate to the edges of the active antenna assembly 113; the copper pillars 107 in the ring 115 may be electrically coupled to a ground plane in the antenna module 100, and may serve as an electromagnetic shield for the components in the active antenna assembly 113 (and may also improve thermal performance by drawing heat away from the RFFE dies 137). The active antenna assembly 113 may include a thermally conductive layer 131 on the top face of the RFFE die 137 to draw heat away from the RFFE die 137 during operation. In some embodiments, the thermally conductive layer 131 may be a metal (e.g., copper). In some embodiments, a layer of solder resist 114 may be disposed at the top face of the active antenna assembly 113, as shown.

The substrate 133 may also include solder resist 114 and conductive contacts 116 at its bottom face, and an antenna patch 104 may be secured to the substrate 133 by solder 122 (or other second-level interconnects) between conductive contacts 120 of the antenna patch 104 and the conductive contacts 116. In some embodiments, the conductive contacts 116/solder 122/conductive contacts 120 may provide an electrically conductive material pathway through which signals may be transmitted to or from the antenna patch 104. In other embodiments, the conductive contacts 116/solder 122/conductive contacts 120 may be used only for mechanical coupling between the antenna patch 104 and the substrate 133. Conductive traces at the proximate face of the substrate 133 may provide vertical and horizontal signals to the antenna patch 104. The height of the solder 122 (or other interconnects) may control the distance between the antenna patch 104 and the proximate face of the substrate 133. In some embodiments, the footprint of the substrate 133 may be smaller than or equal to the footprint of the antenna patch 104. In some embodiments, the footprint of the substrate 133 may be 4 millimeters by 4 millimeters, and a height of the active antenna assembly 113 may be between 1.5 millimeters and 2.5 millimeters (e.g., approximately 2 millimeters). The active antenna assembly 113 may be manufactured as a unit, and one or more of the active antenna assemblies 113 may be used in an antenna module 100 (e.g., by surface mounting the active antenna assemblies 113 to the IC package 108 or to an antenna patch support 110).

Figure 39:
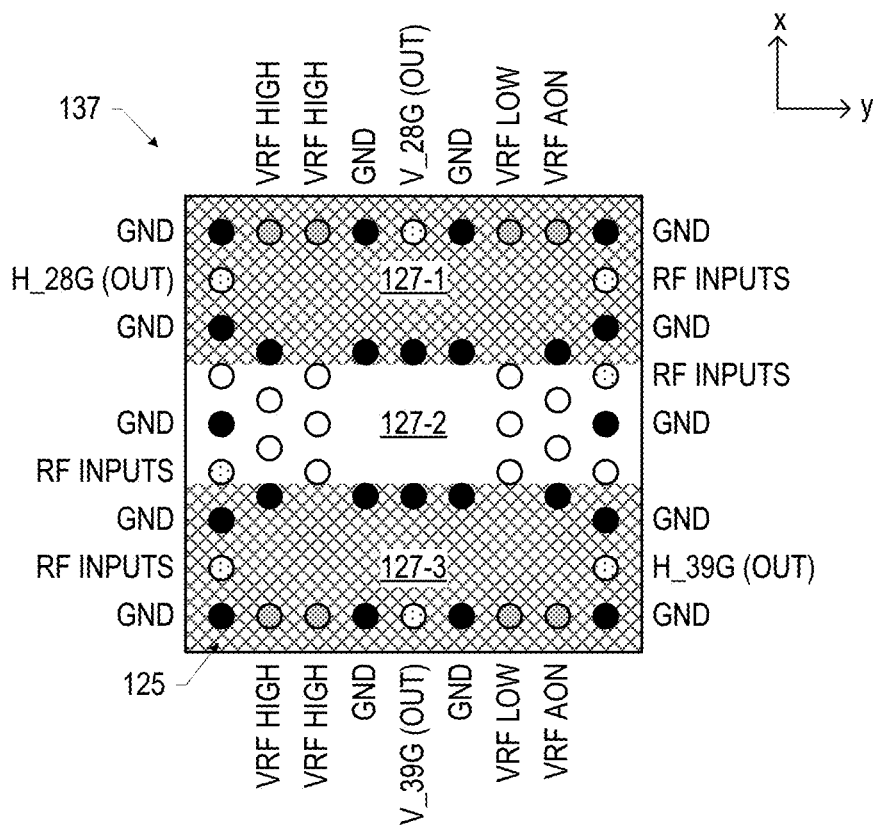
FIG. 39 is a bottom view of an example RFFE die including a control portion, in accordance with various embodiments.

In some embodiments, an RFFE die 137 may include RF control circuitry that assists with the performance of the front-end functionality of the RFFE die 137. For example, the RF control circuitry may provide appropriate bias voltages, CMOS on/off control, and/or feedback. FIG. 39 is a bottom view of an example RFFE die 137 including amplifier portions 127-1 and 127-3 and an RF control portion 127-2, in accordance with various embodiments. The circles in FIG. 39 indicate the location of conductive contacts 119. The amplifier portion 127-1 may include PAs, LNAs, and/or other circuitry to support communications at 28 gigahertz, while the amplifier portion 127-3 may include PAs, LNAs, and/or other circuitry to support communications at 39 gigahertz. The RF control portion 127-2 may include any of the RF control circuitry discussed above (e.g., the unlabeled contacts 119 may be used for communication with the RFFE die 137 to provide bias settings, etc., and/or to communicate with other components).

Figure 40:
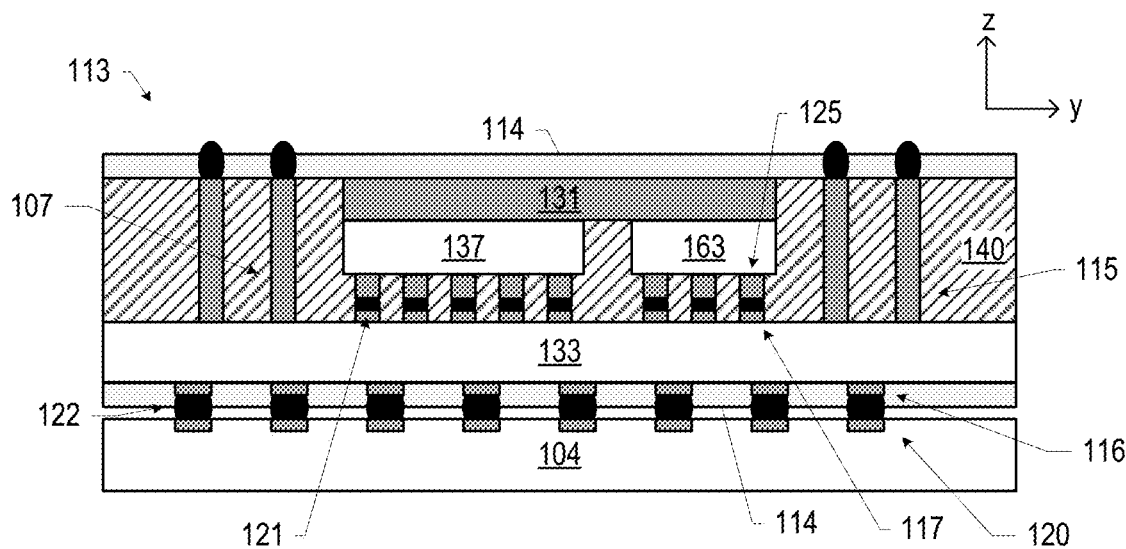
FIG. 40 is a side, cross-sectional view of an active antenna assembly that may be included in an antenna module, in accordance with various embodiments.

In some embodiments, an RFFE die 137 may not include the RF control circuitry discussed above with reference to FIG. 39; instead, that RF control circuitry may be housed in a separate RF control die 163 that is in electrical communication with the RFFE die 137. Any of the antenna modules 100 disclosed herein may include an RFFE die 137 and a separate RF control die 163. For example, FIG. 40 is a side, cross-sectional view of an active antenna assembly 113 that is similar to the active antenna assembly 113 (and may be used accordingly), but in which an RFFE die 137 and an RF control die 163 are both included; the RFFE die 137 and the RF control die 163 may communicate via electrical pathways in the substrate 133. In some embodiments, the RF control die 163 may include CMOS technology, while the RFFE die 137 may include III-V material technology.

Figure 41A:
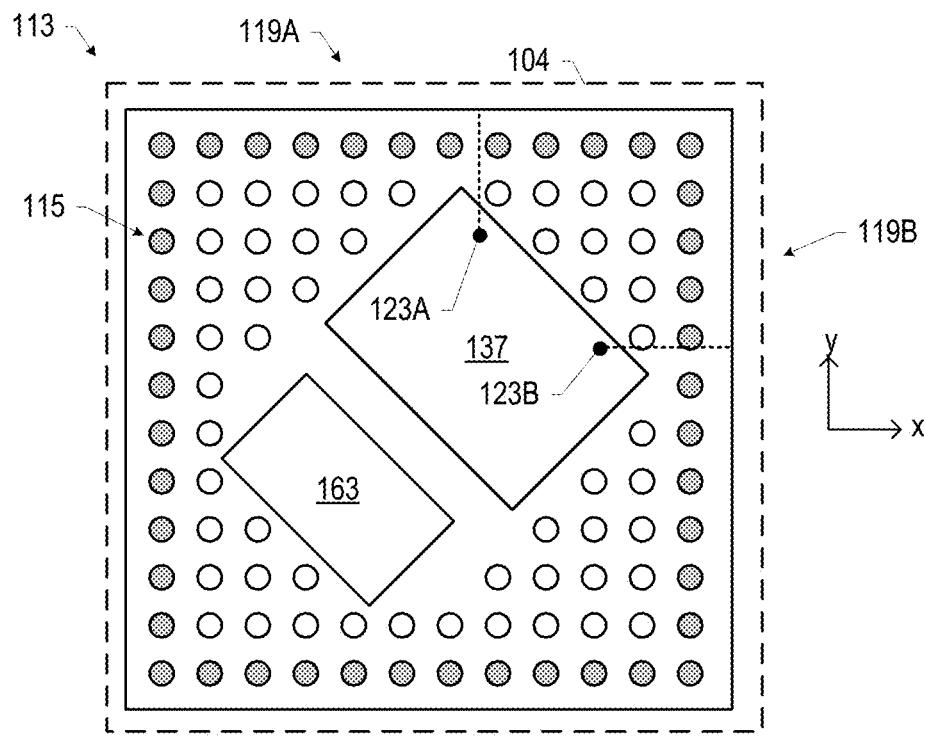
FIGS. 41A and 41B are top views of an RFFE assembly that may be included in an antenna module, in accordance with various embodiments.
Figure 41B:
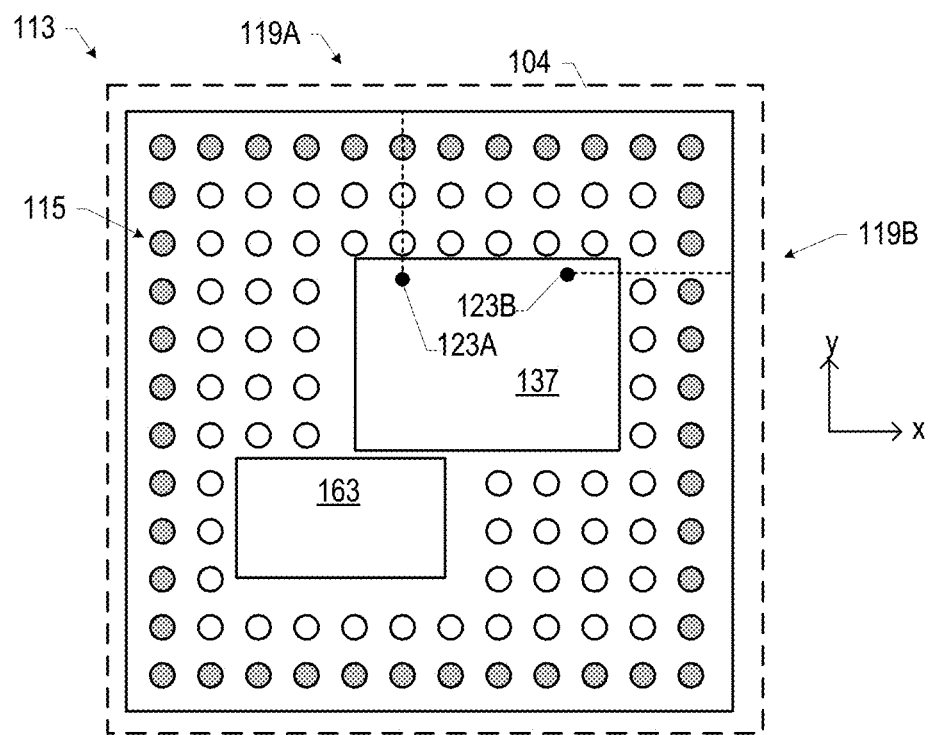

An RFFE die 137 may oriented in an antenna module 100 in any suitable manner. For example, in some embodiments, the footprint of the RFFE die 137 may be rotationally offset from a footprint of an antenna patch 104 associated with the RFFE die 137; that is, the edges of the rectangular footprint of the RFFE die 137 may not be parallel or perpendicular to the edges of the rectangular footprint of the associated antenna patch 104. FIG. 41A is a top view of an active antenna assembly 113 that may be included in an antenna module 100 (e.g., as an antenna board 102 or part of an antenna board 102, as discussed above with reference to FIG. 38) in which the footprint of the RFFE die 137 is rotationally offset (in this example, by 45 degrees) from the rectangular footprint of an associated antenna patch 104. In such an arrangement, when the RFFE die 137 includes an output contact 123A for a horizontal antenna signal and an output contact 123B for a vertical antenna signal (e.g., as discussed above with reference to FIG. 37) along a same side of the RFFE die 137 (e.g., for orthogonal dual polarization), as shown, the distance from the output contact 123A to the horizontal edge 119A of the antenna patch 104, and the distance from the output contact 123B to the vertical edge 119B of the antenna patch 104, may be reduced relative to an embodiment in which the footprint of the RFFE die 137 is not rotationally offset from the footprint of the antenna patch 104. Reducing these distances (indicated by dashed lines in FIG. 41A) may reduce losses, and thus improve efficiency. Further, the horizontal and vertical connections may be symmetric. An RFFE die 137 included in an IC package 108 (e.g., as discussed above with reference to FIG. 1B) may also have a footprint that is rotationally offset from the footprint of the IC package 108. FIG. 41B is a top view of active antenna assembly 113 that may be included in antenna module 100 in which the footprint of the RFFE die 137 is not rotationally offset from the rectangular footprint of an associated antenna patch 104.

In the embodiment illustrated in FIG. 41A, an RF control die 163 is also illustrated (and is rotationally offset), but in some embodiments, the RF control circuitry of the RF control die 163 may be included in the RFFE die 137, and no RF control die 163 may be present. FIGS. 41A and 41B also illustrate a ring 115 of copper pillars 107 around the periphery of the substrate 133. In some embodiments, the footprint of the active antenna assembly 113 may be smaller than a footprint of an associated antenna patch 104, as shown in FIGS. 41A and 41B. In some embodiments, the footprint of the RFFE die 137 may be between 1.5 millimeters and 2 millimeters (e.g., 1.7 millimeters) by between 1 millimeter and 1.5 millimeters (e.g., 1.3 millimeters).

Figure 42:
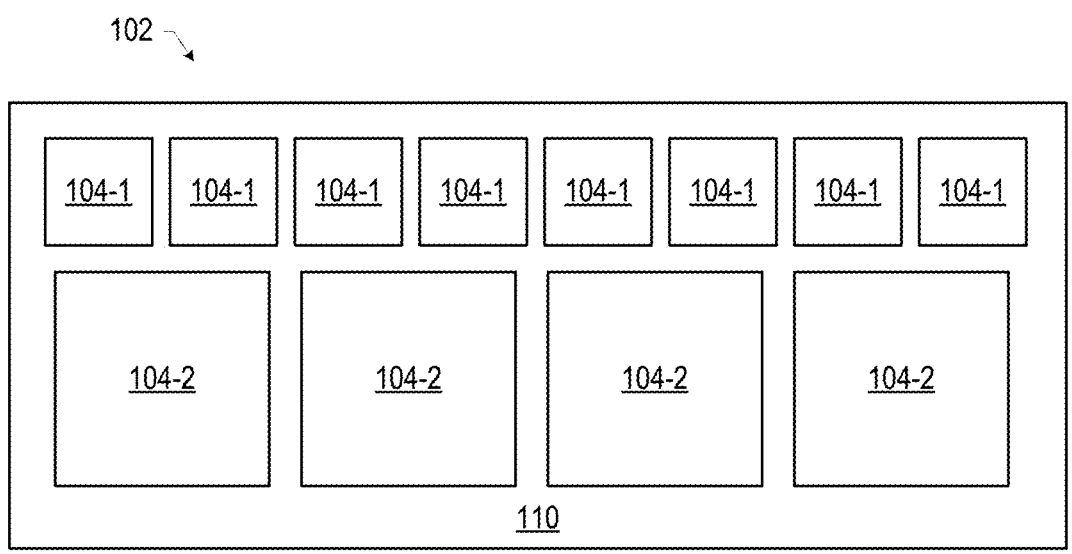
FIG. 42 is a bottom view of an example arrangement of antenna patches in an antenna board, in accordance with various embodiments.

As noted above, an antenna module 100 may include any suitable arrangement of antenna patches 104. For example, FIG. 42 is a bottom view of an example arrangement of antenna patches 104 on an antenna patch support 110 of an antenna board 102, in accordance with various embodiments. The antenna board 102 of FIG. 41 includes an array of eight antenna patches 104-1 in parallel with an array of four antenna patches 104-2; the antenna patches 104-1 may have a smaller footprint than the antenna patches 104-2. For example, in some embodiments, the antenna patches 104-1 may support 60 gigahertz communications, while the antenna patches 104-2 may support millimeter wave communication (e.g., 5G millimeter wave communication). The antenna patch support 110 may take any of the forms disclosed herein.

Figure 43:
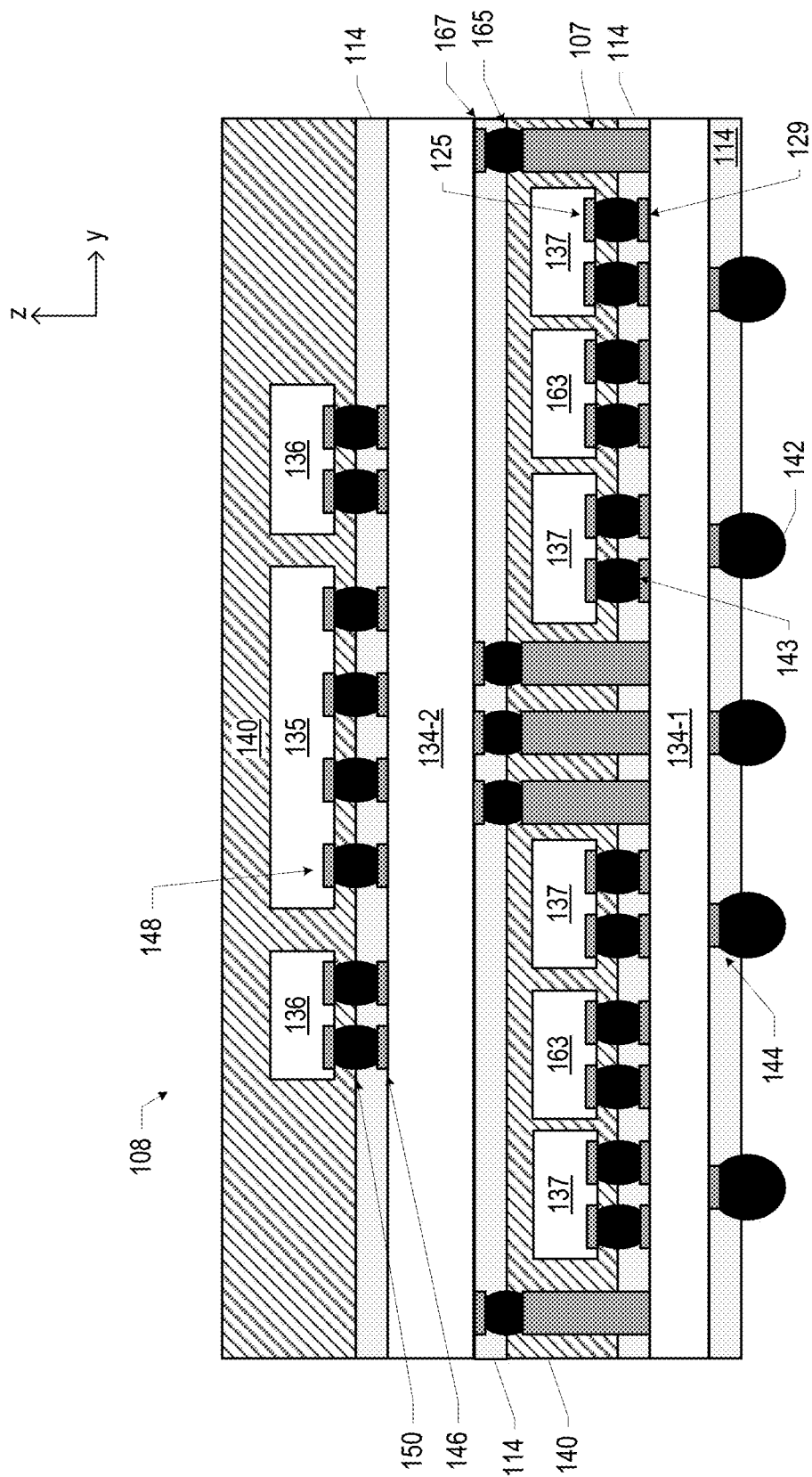
FIGS. 43 and 44 are side, cross-sectional views of example IC packages, in accordance with various embodiments.
Figure 44:
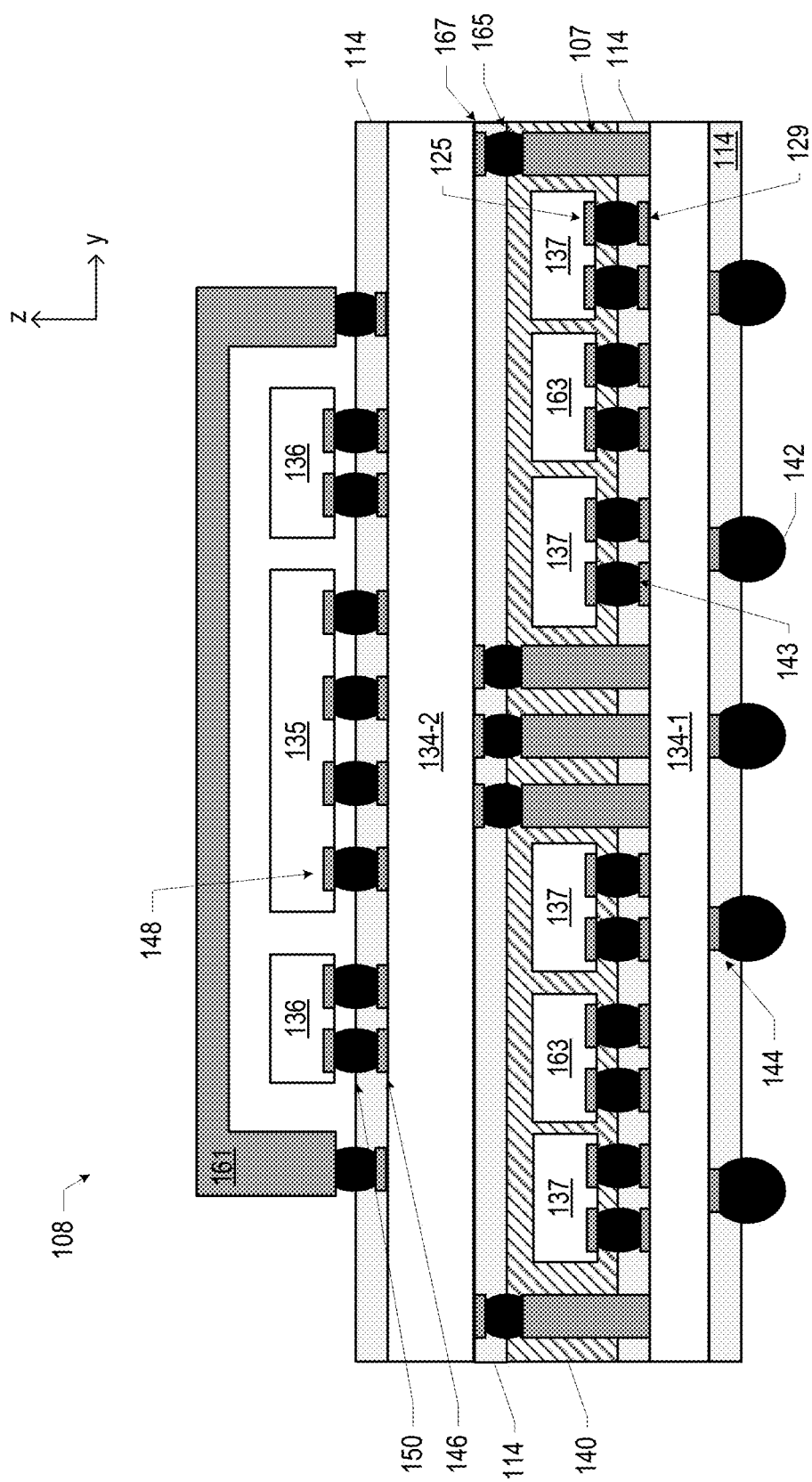

The IC packages 108 illustrated in FIG. 17 are simply illustrative, and an antenna module 100 may include IC packages having other structures. For example, FIGS. 43 and 44 are side, cross-sectional views of example IC packages 108, in accordance with various embodiments. In particular, FIGS. 43 and 44 are examples of stacked IC packages that may be used in an antenna module 100 as described above with reference to FIG. 1B. The embodiments of FIGS. 43 and 44 share many features with the embodiment of FIG. 17B, and these shared features may take any of the forms disclosed herein.

In FIG. 43, RFFE dies 137 and RF control dies 163 are coupled to the package substrate 134-1, and copper pillars 107 couple the package substrates 134-1 and 134-2. The embodiment of FIG. 43 may also include a conformal metal shield 152 (not shown). In some embodiments, the height of the mold material 140 above the substrate 134-2 may be between 300 microns and 1000 microns (e.g., approximately 500 microns). In some embodiments, the height of the mold material 140 above the substrate 134-1 may be between 100 microns and 500 microns (e.g., between 200 microns and 250 microns). In some embodiments, the thickness of the substrates 134-1 and 134-2 may be between 50 microns and 100 microns (e.g., approximately 80 microns), and/or may be a three-layer coreless substrate.

In FIG. 44, RFFE dies 137 and RF control dies 163 are coupled to the package substrate 134-1, and copper pillars 107 couple the package substrates 134-1 and 134-2. In contrast to the embodiment of FIG. 43, the embodiment of FIG. 44 does not include a mold material 140 above the package substrate 134-2, but instead includes a mechanical shield 161 coupled to the package substrate 134-2 by solder. The mechanical shield 161 may protect the underlying logic die 135 and components 136, and may provide desirable stiffness to the IC package 108. The mechanical shield 161 may be formed of any suitable material, such as a metal. In some embodiments, the height of the mechanical shield 161 may be between 0.5 millimeters and 1 millimeter (e.g., approximately 0.8 millimeters). In some embodiments, the mechanical shield 161 may only partially cover the entire top surface of the IC package 108, permitting the antennas patches 104 (not shown) to extend beyond the limits of the shielding as dipoles, surface mount antennas, and/or edge fire antennas, for example. More generally, any of the shields or mold materials disclosed herein may be selectively positioned to allow antenna patches 104 to be positioned for desired operation (e.g., within or on the package substrate 134-2).

Figure 45:
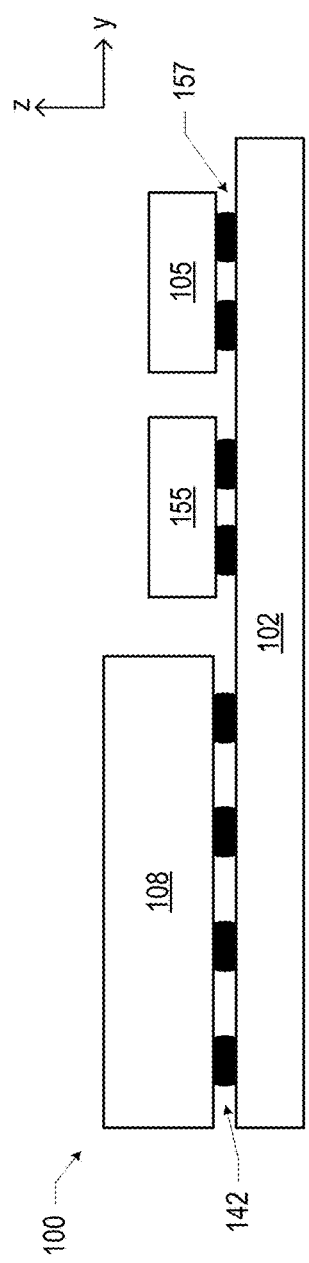
FIGS. 45-47 are side, cross-sectional views of example antenna modules, in accordance with various embodiments.
Figure 46:
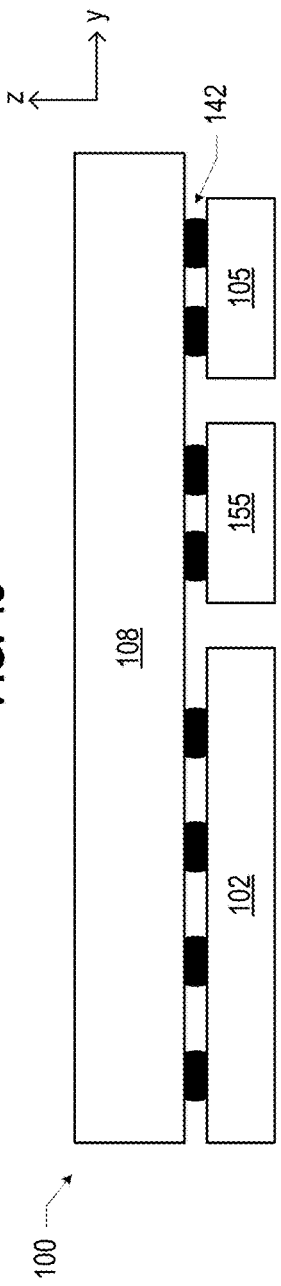

An antenna module 100 may include an IC package, an antenna board 102, and additional components, as desired. For example, FIG. 45 illustrates an embodiment in which an antenna module 100 includes an antenna board 102, an IC package 108 coupled to a face of the antenna board 102 (with the antenna board 102 having a larger footprint than the IC package 108), a connector 105 coupled to the same face of the antenna board 102 (e.g., coaxial cable connectors, the flat cable connectors discussed above with reference to FIGS. 29 and 30, any of the other forms disclosed herein, etc.), and a DC-DC converter component 155 coupled to the same face of the antenna board 102. FIG. 46 illustrates an embodiment in which an antenna module 100 includes an IC package 108, an antenna board 102 coupled to a face of the IC package 108 (with the antenna board 102 having a smaller footprint than the IC package 108), a connector 105 coupled to the same face of the IC package 108 (e.g., coaxial cable connectors, the flat cable connectors discussed above with reference to FIGS. 29 and 30, any of the other forms disclosed herein, etc.), and a DC-DC converter component 155 coupled to the same face of the IC package 108. The antenna module of FIG. 46 may be an embodiment of the antenna module 100 discussed above with reference to FIG. 34.

Figure 47:
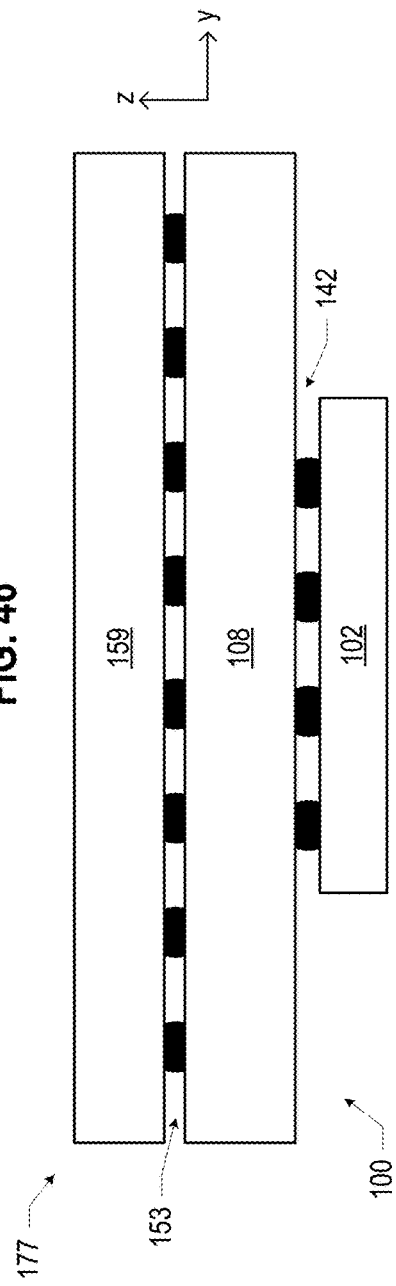

In some embodiments, an IC package 108 in an antenna module may be "double-sided" in that the IC package 108 includes conductive contacts on two opposing faces of the IC package. For example, FIG. 47 illustrates an electronic assembly 177 including an antenna module 100 coupled to a circuit board 159 (e.g., a motherboard). Such an electronic assembly 177 may be included in a communication device, such as any of the communication devices disclosed herein. In FIG. 47, the IC package 108 is double-sided, with one face electrically and mechanically coupled to an antenna board 102 by second-level interconnects 142, and an opposite face electrically and mechanically coupled to the circuit board 159 by second-level interconnects 153.

Figure 48:
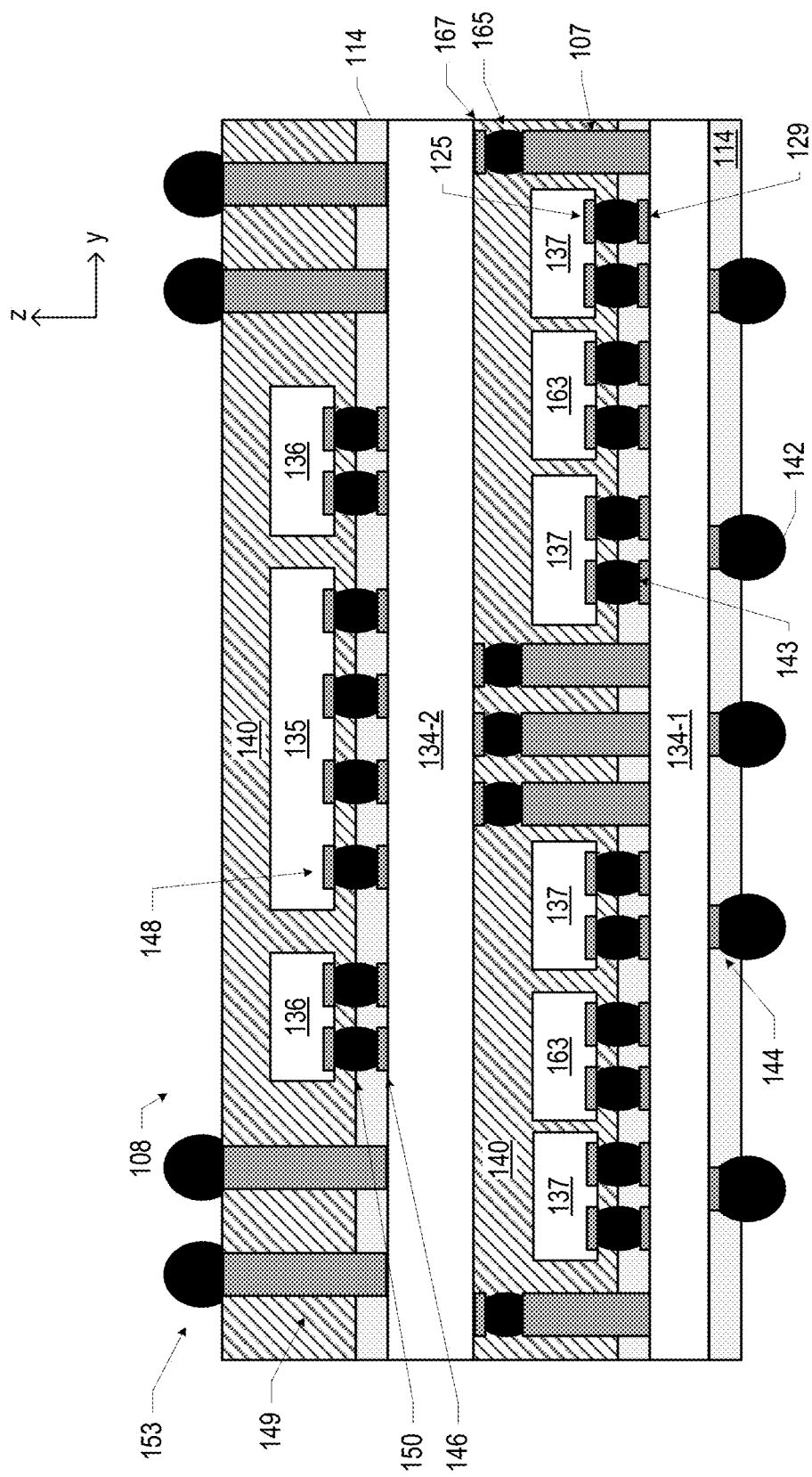
FIGS. 48-49 are side, cross-sectional views of example double-sided IC packages, in accordance with various embodiments.
Figure 49:
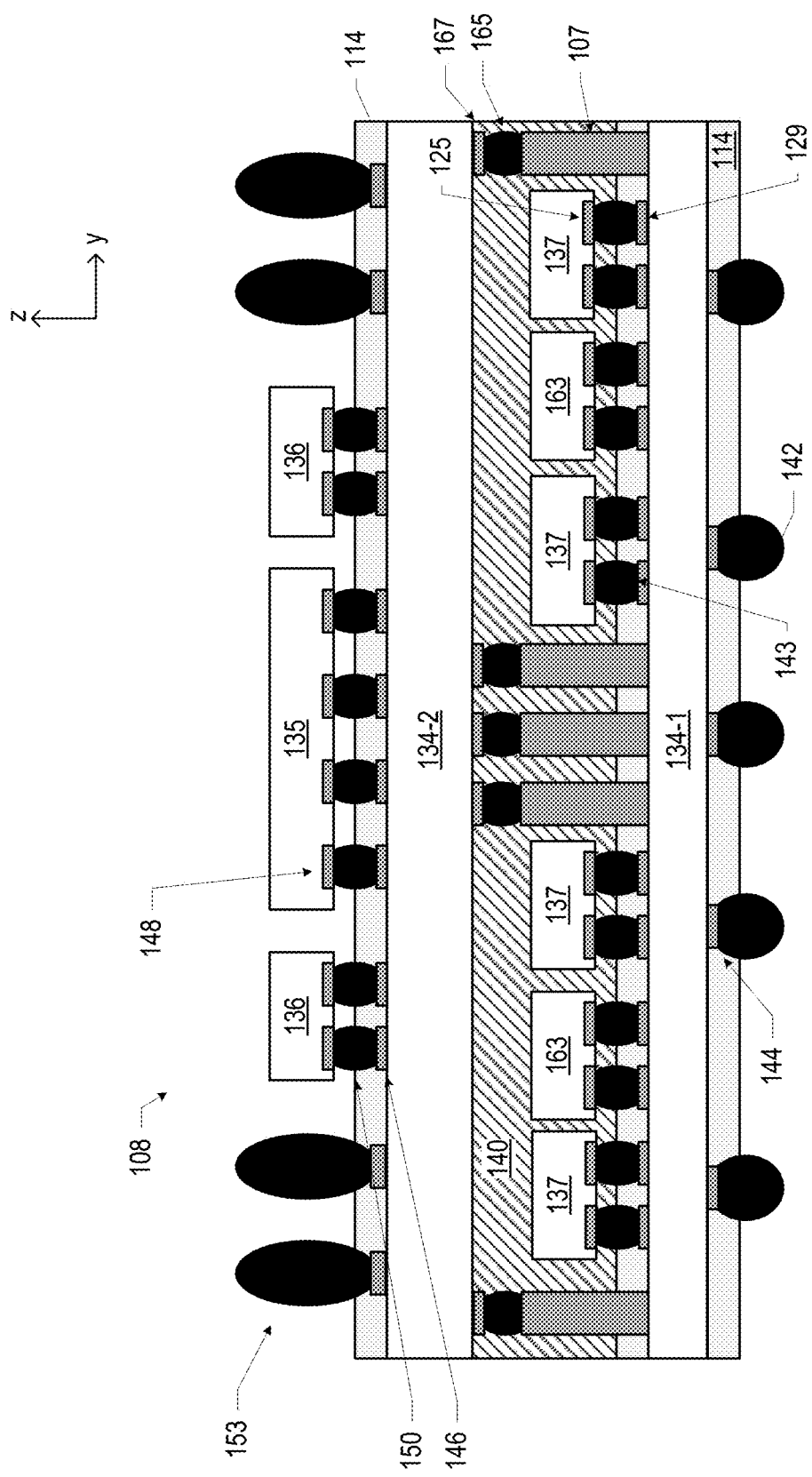

A double-sided IC package 108 may take any of a number of forms. For example, FIGS. 48-49 are side, cross-sectional views of example double-sided IC packages 108, in accordance with various embodiments. The embodiments of FIGS. 48 and 49 share many features with the embodiments of FIGS. 17B, 43, and 44, and these shared features may take any of the forms disclosed herein. In the embodiment of FIG. 48, copper pillars 149 may extend from the top face of the package substrate 134-2, through the mold material 140, and second-level interconnects 153 (e.g., solder) may be disposed at the top face of the IC package 108. Communication between the circuit board 159 (not shown in FIG. 48, but discussed above with reference to FIG. 47) and the logic die 135 may take place through electrical pathways including the copper pillars 149 and the package substrate 134-2. In some embodiments, the outermost copper pillars 149 may form a ring that provides an electromagnetic shield, as discussed above with reference to the ring 115.

In the embodiment of FIG. 49, no copper pillars may extend from the top face of the package substrate 134-2; instead, the second-level interconnects 153 may be solder-coated copper spheres, or solder balls, formed to a desired height (e.g., taller than the components 136 and the logic die 135) and the circuit board 159 (not shown in FIG. 49, but discussed above with reference to FIG. 46) may couple to the second-level interconnects 153. An underfill material (not shown) may be present between the substrate 134-2 and the components 136/logic die 135. An embodiment like that illustrated in FIG. 49 may be particularly advantageous when the components 136 on the substrate 134-2 have a lower profile, enabling the IC package 108 to be made thinner. IC packages 108 like FIG. 48 may be more appropriate when the components 136 are taller; for example, when the components 136 include DC-DC converter circuitry.

The antenna modules 100 disclosed herein may include, or be included in, any suitable electronic component. FIGS. 50-53 illustrate various examples of apparatuses that may include, or be included in, any of the antenna modules 100 disclosed herein.

Figure 50:
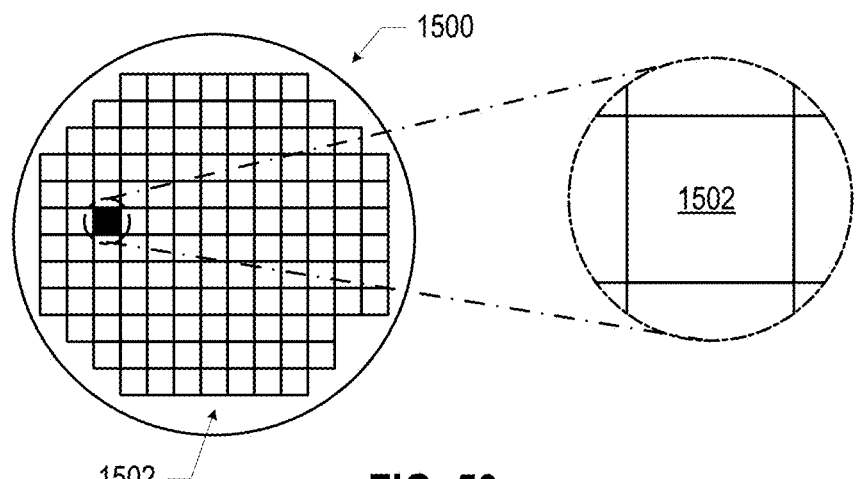
FIG. 50 is a top view of a wafer and dies that may be included in an antenna module, in accordance with any of the embodiments disclosed herein.

FIG. 50 is a top view of a wafer 1500 and dies 1502 that may be included in any of the antenna modules 100 disclosed herein. For example, a die 1502 may be included in an IC package 108 (e.g., as a component 136) or in an antenna patch 104. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more transistors (e.g., some of the transistors 1640 of FIG. 51, discussed below) and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 53) or other logic that is configured to store information in the memory devices or execute instructions stored in the memory array.

Figure 51:
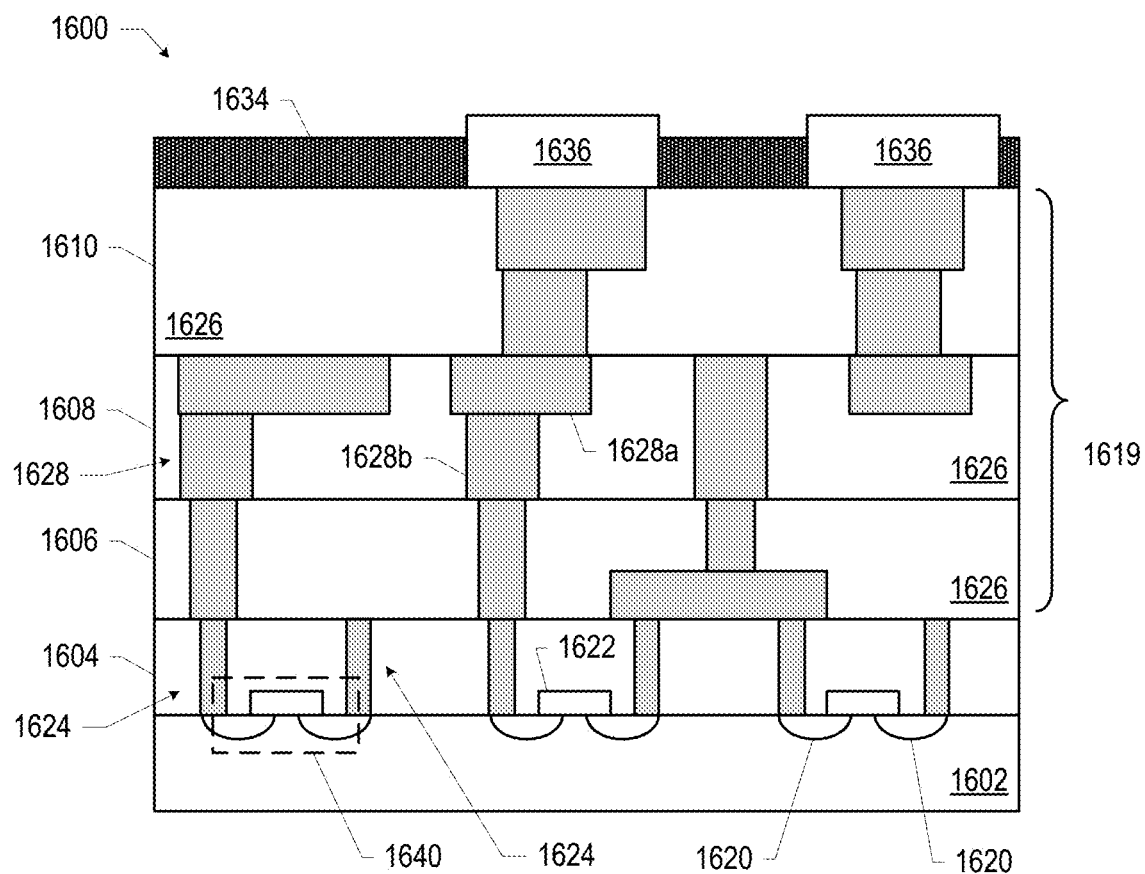
FIG. 51 is a side, cross-sectional view of an IC device that may be included in an antenna module, in accordance with any of the embodiments disclosed herein.

FIG. 51 is a side, cross-sectional view of an IC device 1600 that may be included in any of the antenna modules 100 disclosed herein. For example, an IC device 1600 may be included in an IC package 108 (e.g., as a component 136). The IC device 1600 may be formed on a substrate 1602 (e.g., the wafer 1500 of FIG. 50) and may be included in a die (e.g., the die 1502 of FIG. 50). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 50) or a wafer (e.g., the wafer 1500 of FIG. 50).

The IC device 1600 may include one or more device layers 1604 disposed on the substrate 1602. The device layer 1604 may include features of one or more transistors 1640 (e.g., metal-oxide-semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 51 and may include a wide variety of other types and configurations such as, for example, planar transistors, non-planar transistors, or a combination of both. Planar transistors may include bipolar junction transistors (BJT), heterojunction bipolar transistors (HBT), or high-electron-mobility transistors (HEMT). Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal-oxide-semiconductor (PMOS) or an n-type metal-oxide-semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., the transistors 1640) of the device layer 1604 through one or more interconnect layers disposed on the device layer 1604 (illustrated in FIG. 51 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600.

The interconnect structures 1628 may be arranged within the interconnect layers 1606-1610 to route electrical signals according to a wide variety of designs (in particular, the arrangement is not limited to the particular configuration of interconnect structures 1628 depicted in FIG. 51). Although a particular number of interconnect layers 1606-1610 is depicted in FIG. 51, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 51. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 51. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 may be formed above the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 may be formed above the first interconnect layer 1606. In some embodiments, the second interconnect layer 1608 may include vias 1628*b* to couple the lines 1628*a* of the second interconnect layer 1608 with the lines 1628*a* of the first interconnect layer 1606. Although the lines 1628*a* and the vias 1628*b* are structurally delineated with a line within each interconnect layer (e.g., within the second interconnect layer 1608) for the sake of clarity, the lines 1628*a* and the vias 1628*b* may be structurally and/or materially contiguous (e.g., simultaneously filled during a dual-damascene process) in some embodiments.

A third interconnect layer 1610 (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., farther away from the device layer 1604) may be thicker.

The IC device 1600 may include a solder resist material 1634 (e.g., polyimide or similar material) and one or more conductive contacts 1636 formed on the interconnect layers 1606-1610. In FIG. 51, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 52:
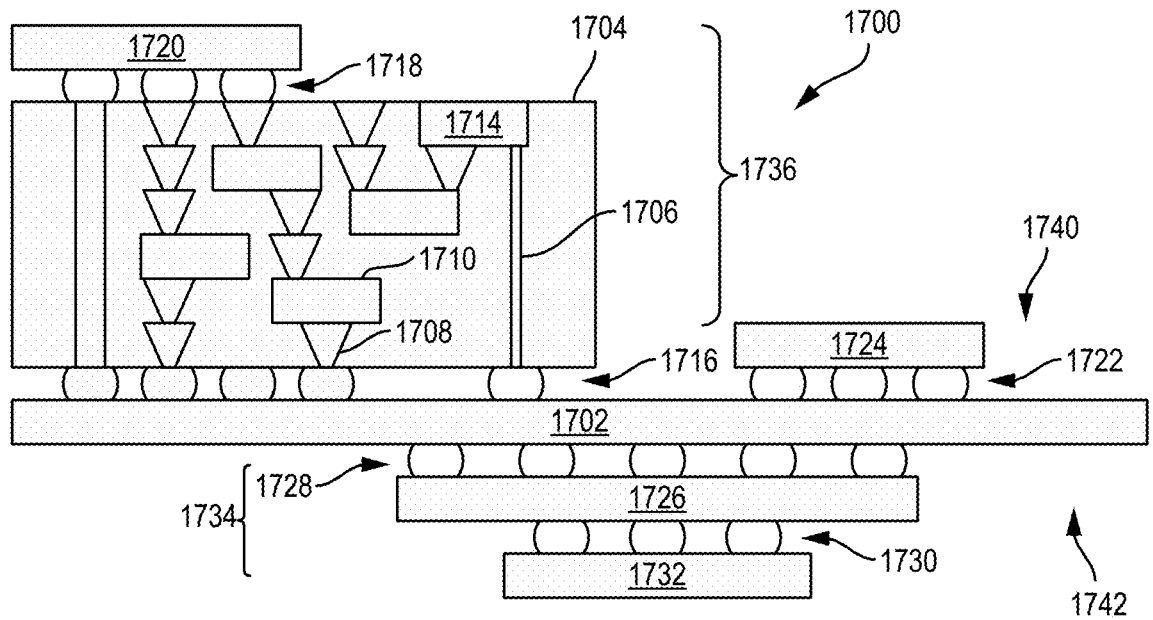
FIG. 52 is a side, cross-sectional view of an IC device assembly that may include an antenna module, in accordance with any of the embodiments disclosed herein.

FIG. 52 is a side, cross-sectional view of an IC device assembly 1700 that may include one or more of the antenna modules 100 disclosed herein. In particular, any suitable ones of the antenna modules 100 disclosed herein may take the place of any of the components of the IC device assembly 1700 (e.g., an antenna module 100 may take the place of any of the IC packages of the IC device assembly 1700).

The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742.

In some embodiments, the circuit board 1702 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 52 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702, and may include solder balls (as shown in FIG. 52), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 52, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 50), an IC device (e.g., the IC device 1600 of FIG. 51), or any other suitable component. Generally, the interposer 1704 may spread a connection to a wider pitch or reroute a connection to a different connection. For example, the interposer 1704 may couple the IC package 1720 (e.g., a die) to a set of ball grid array (BGA) conductive contacts of the coupling components 1716 for coupling to the circuit board 1702. In the embodiment illustrated in FIG. 52, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

In some embodiments, the interposer 1704 may be formed as a PCB, including multiple metal layers separated from one another by layers of dielectric material and interconnected by electrically conductive vias. In some embodiments, the interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group Ill-V and group IV materials. The interposer 1704 may include metal interconnects 1708 and vias 1710, including but not limited to through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as RF devices, PAs, power management devices, antennas, arrays, sensors, and microelectromechanical systems (MEMS) devices may also be formed on the interposer 1704. The package-on-interposer structure 1736 may take the form of any of the package-on-interposer structures known in the art.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 52 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 53:
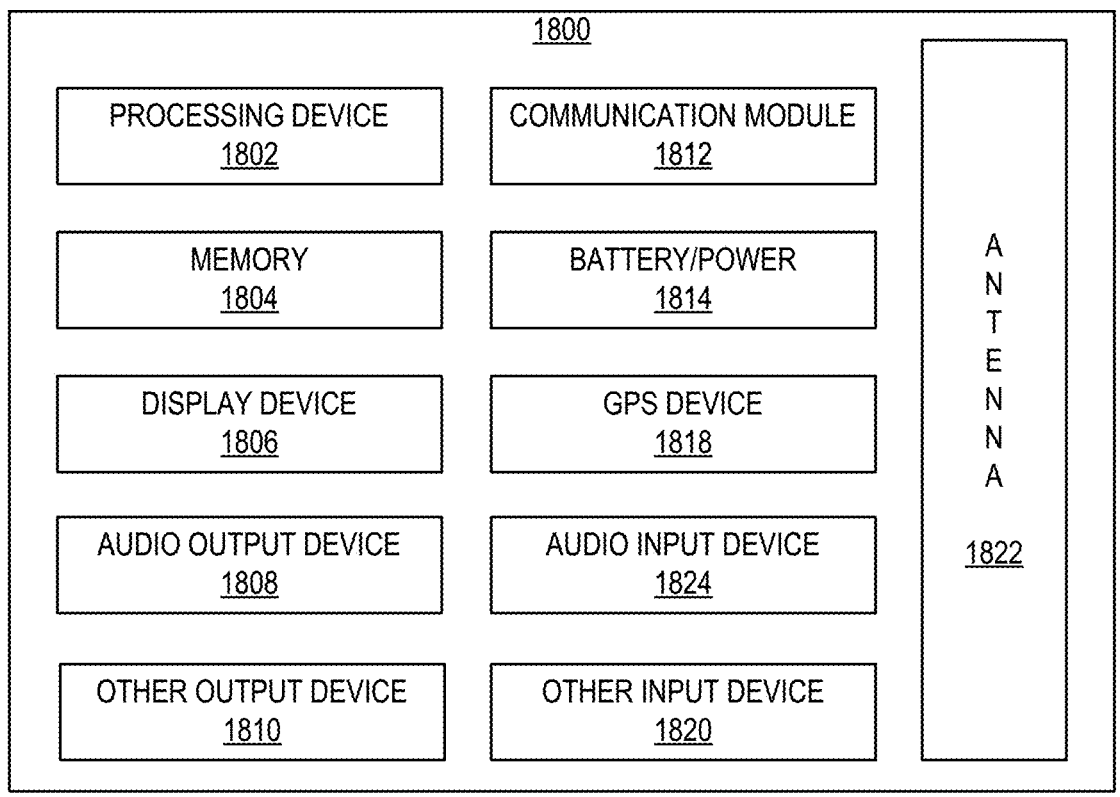
FIG. 53 is a block diagram of an example communication device that may include an antenna module, in accordance with any of the embodiments disclosed herein.

FIG. 53 is a block diagram of an example communication device 1800 that may include one or more antenna modules 100, in accordance with any of the embodiments disclosed herein. The communication device 151 (FIG. 18), the handheld communication device 198 (FIG. 30), and the laptop communication device 190 (FIG. 31) may be examples of the communication device 1800. Any suitable ones of the components of the communication device 1800 may include one or more of the IC packages 1650, IC devices 1600, or dies 1502 disclosed herein. A number of components are illustrated in FIG. 53 as included in the communication device 1800, but any one or more of these components may be omitted or duplicated, as suitable for the application. In some embodiments, some or all of the components included in the communication device 1800 may be attached to one or more motherboards. In some embodiments, some or all of these components are fabricated onto a single system-on-a-chip (SoC) die.

Additionally, in various embodiments, the communication device 1800 may not include one or more of the components illustrated in FIG. 53, but the communication device 1800 may include interface circuitry for coupling to the one or more components. For example, the communication device 1800 may not include a display device 1806, but may include display device interface circuitry (e.g., a connector and driver circuitry) to which a display device 1806 may be coupled. In another set of examples, the communication device 1800 may not include an audio input device 1824 or an audio output device 1808, but may include audio input or output device interface circuitry (e.g., connectors and supporting circuitry) to which an audio input device 1824 or audio output device 1808 may be coupled.

The communication device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The communication device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-MRAM).

In some embodiments, the communication device 1800 may include a communication module 1812 (e.g., one or more communication modules). For example, the communication module 1812 may be configured for managing wireless communications for the transfer of data to and from the communication device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not. The communication module 1812 may be, or may include, any of the antenna modules 100 disclosed herein.

The communication module 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication module 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication module 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication module 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication module 1812 may operate in accordance with other wireless protocols in other embodiments. The communication device 1800 may include an antenna 1822 to facilitate wireless communications and/or to receive other wireless communications (such as AM or FM radio transmissions).

In some embodiments, the communication module 1812 may manage wired communications, such as electrical, optical, or any other suitable communication protocols (e.g., the Ethernet). As noted above, the communication module 1812 may include multiple communication modules. For instance, a first communication module 1812 may be dedicated to shorter-range wireless communications such as Wi-Fi or Bluetooth, and a second communication module 1812 may be dedicated to longer-range wireless communications such as global positioning system (GPS), EDGE, GPRS, CDMA, WiMAX, LTE, EV-DO, or others. In some embodiments, a first communication module 1812 may be dedicated to wireless communications, and a second communication module 1812 may be dedicated to wired communications. In some embodiments, the communication module 1812 may include an antenna module 100 that supports millimeter wave communication.

The communication device 1800 may include battery/power circuitry 1814. The battery/power circuitry 1814 may include one or more energy storage devices (e.g., batteries or capacitors) and/or circuitry for coupling components of the communication device 1800 to an energy source separate from the communication device 1800 (e.g., AC line power).

The communication device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The communication device 1800 may include an audio output device 1808 (or corresponding interface circuitry, as discussed above). The audio output device 1808 may include any device that generates an audible indicator, such as speakers, headsets, or earbuds.

The communication device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The communication device 1800 may include a GPS device 1818 (or corresponding interface circuitry, as discussed above). The GPS device 1818 may be in communication with a satellite-based system and may receive a location of the communication device 1800, as known in the art.

The communication device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The communication device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The communication device 1800 may have any desired form factor, such as a handheld or mobile communication device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop communication device, a server or other networked computing component, a printer, a scanner, a monitor, a set-top box, an entertainment control unit, a vehicle control unit, a digital camera, a digital video recorder, or a wearable communication device. In some embodiments, the communication device 1800 may be any other electronic device that processes data.

The following paragraphs provide examples of various ones of the embodiments disclosed herein.

Example 1 is an antenna module, including: a logic die; a radio frequency front-end (RFFE) die in electrical communication with the logic die; and an antenna patch, wherein the RFFE die is closer to the antenna patch than the logic die is to the antenna patch.

Example 2 may include the subject matter of Example 1, and may further specify that the logic die includes complementary metal-oxide-semiconductor (CMOS) circuitry.

Example 3 may include the subject matter of any of Examples 1-2, and may further specify that the RFFE die includes a Ill-V material.

Example 4 may include the subject matter of any of Examples 1-3, and may further specify that the RFFE die includes a low noise amplifier.

Example 5 may include the subject matter of any of Examples 1-4, and may further specify that the RFFE die includes a power amplifier.

Example 6 may include the subject matter of any of Examples 1-5, and may further specify that the RFFE die includes RF control circuitry.

Example 7 may include the subject matter of any of Examples 1-6, and may further include: an RF control die, including RF control circuitry, in electrical communication with the RFFE die.

Example 8 may include the subject matter of Example 7, and may further specify that the RF control die is closer to the RFFE die than the logic die is to the RFFE die.

Example 9 may include the subject matter of any of Examples 1-8, and may further specify that the logic die and the RFFE die are included in a stacked package.

Example 10 may include the subject matter of Example 9, and may further specify that the antenna patch is coupled to an antenna patch support, and the stacked package is coupled to the antenna patch support.

Example 11 may include the subject matter of Example 10, and may further specify that the antenna patch support includes a printed circuit board.

Example 12 may include the subject matter of any of Examples 10-11, and may further include: one or more connectors coupled to the antenna patch support.

Example 13 may include the subject matter of any of Examples 1-12, and may further specify that the logic die is included in an integrated circuit (IC) package, the RFFE die is included in an antenna board, and the IC package is coupled to a face of the antenna board.

Example 14 may include the subject matter of any of Examples 1-13, and may further specify that the logic die has an output power between 0 dbm and 5 dbm, and the RFFE die has an output power between 20 dbm and 35 dbm.

Example 15 may include the subject matter of any of Examples 1-14, and may further specify that a footprint of the RFFE die is rotationally offset from a footprint the antenna patch.

Example 16 may include the subject matter of any of Examples 1-15, and may further specify that the RFFE die is one of a plurality of RFFE dies included in the antenna module, the antenna patch is one of a plurality of antenna patches included in the antenna module, different ones of the RFFE dies are associated with different ones of the antenna patches, and individual RFFE dies are closer to their associated antenna patch than the logic die is to that antenna patch.

Example 17 may include the subject matter of any of Examples 1-16, and may further specify that an electrical pathway in the antenna module between the logic die and the RFFE die includes a copper pillar.

Example 18 may include the subject matter of Example 17, and may further specify that the electrical pathway includes multiple copper pillars.

Example 19 may include the subject matter of any of Examples 1-18, and may further specify that the antenna patch is one of a plurality of antenna patches in the antenna module.

Example 20 may include the subject matter of Example 19, and may further specify that the plurality of antenna patches includes a first array of antenna patches having a first size, and a second array of antenna patches having a second size different from the first size.

Example 21 may include the subject matter of any of Examples 1-20, and may further include: a ring of copper pillars around the RFFE die.

Example 22 may include the subject matter of any of Examples 1-21, and may further specify that the logic die is included in an integrated circuit (IC) package, and the antenna module further includes: one or more connectors coupled to the IC package.

Example 23 is an antenna module, including: a radio frequency front-end (RFFE) die; and an antenna patch, wherein the RFFE die is above the antenna patch and a footprint of the RFFE die is rotationally offset from a footprint of the antenna patch.

Example 24 may include the subject matter of Example 23, and may further include: an RF control die, including RF control circuitry, in electrical communication with the RFFE die, wherein the RF control die is above the antenna patch and a footprint of the RF control die is rotationally offset from the footprint of the antenna patch.

Example 25 may include the subject matter of any of Examples 23-24, and may further specify that the RFFE die is coupled to a support, and a footprint of the support is smaller than or equal to a footprint of the antenna patch.

Example 26 may include the subject matter of any of Examples 23-25, and may further specify that the RFFE die is coupled to a support, the support includes a cavity, and the antenna patch is located over the cavity.

Example 27 is an electronic assembly, including: an integrated circuit (IC) package; an antenna patch support, wherein the IC package is coupled to the antenna patch support; one or more antenna patches coupled to the antenna patch support; and a circuit board, wherein the IC package is coupled to the circuit board and the IC package is between the circuit board and the antenna patch support.

Example 28 may include the subject matter of Example 27, and may further specify that the IC package includes copper pillars.

Example 29 may include the subject matter of any of Examples 27-28, and may further specify that the IC package is coupled to the antenna patch support and to the circuit board by solder.

Example 30 may include the subject matter of any of Examples 27-29, and may further specify that the IC package includes a logic die, and the electronic assembly further includes a radio frequency front-end (RFFE) die in electrical communication with the logic die and between the logic die and the one or more antenna patches.

Example 31 may include the subject matter of Example 30, and may further specify that the RFFE die is included in the IC package.

Example 32 may include the subject matter of Example 30, and may further specify that the RFFE die is included in the antenna patch support.

Example 33 may include the subject matter of any of Examples 30-32, and may further specify that the RFFE die includes a low noise amplifier or a power amplifier.

Example 34 may include the subject matter of any of Examples 27-33, and may further specify that the IC package includes a mold material at a face of the IC package proximate to the circuit board.

Example 35 may include the subject matter of any of Examples 27-33, and may further specify that the IC package does not include a mold material at a face of the IC package proximate to the circuit board.

Example 36 is a communication device, including: a logic die; a radio frequency front-end (RFFE) die in electrical communication with the logic die; an antenna patch, wherein the RFFE die is closer to the antenna patch than the logic die is to the antenna patch; and a display.

Example 37 may include the subject matter of Example 36, and may further specify that the communication device is a handheld communication device.

Example 38 may include the subject matter of any of Examples 36-37, and may further specify that the antenna patch is part of a millimeter wave antenna array.

Example 39 is an antenna assembly, including: a substrate, wherein the substrate has a first face and an opposing second face; a radio frequency front-end (RFFE) die coupled to the first face; and an antenna patch coupled to the second face.

Example 40 may include the subject matter of Example 39, and may further specify that a footprint of the RFFE die is rotationally offset from a footprint of the antenna patch.

Example 41 may include the subject matter of any of Examples 39-40, and may further specify that the antenna patch is surface mounted to the second face.

Example 42 may include the subject matter of any of Examples 39-41, and may further include: a plurality of copper pillars extending from the second face of the substrate.

Example 43 may include the subject matter of Example 42, and may further include: a mold material around the plurality of copper pillars.

Example 44 may include the subject matter of any of Examples 39-43, and may further include: an RF control die, including RF control circuitry, in electrical communication with the RFFE die, wherein the RF control die is coupled to the first face of the substrate.

Example 45 may include the subject matter of any of Examples 39-44, and may further specify that a footprint of the substrate is smaller than or equal to a footprint of the antenna patch.

The invention claimed is:

1. An antenna module, comprising:
   a plurality of antenna patches in a first plane defined in linear co-ordinates by a first axis and an orthogonal second axis; and
   a radio frequency front-end (RFFE) die in a second plane parallel to the first plane and offset from the first plane along a third axis mutually orthogonal to the first axis and the second axis,
   wherein:
      the antenna patches are arranged in a linear array along the first axis with a center of each antenna patch along the first axis,
      each antenna patch has an edge along a fourth axis in the first plane, and
      there is a non-zero angle between the fourth axis and the first axis.

2. The antenna module of claim 1, wherein the antenna patches are arranged in an antenna board.

3. The antenna module of claim 2, wherein:
the RFFE die comprises RFFE circuitry,
the antenna module comprises another die including logic circuitry on the antenna board, and the logic circuitry is configured to control operations of the RFFE circuitry.

4. The antenna module of claim 3, wherein:
the die including the logic circuitry is in an integrated circuit (IC) package,
the RFFE die is in the antenna board, and the
IC package is coupled to a face of the antenna board.

5. The antenna module of claim 1, wherein any one antenna patch includes a plurality of antenna layers.

6. The antenna module of claim 1, further comprising additional antenna patches in the linear array with zero angle between the fourth axis and the first axis.

7. The antenna module of claim 1, wherein the antenna module is to support communication in a plurality of frequencies.

8. The antenna module of claim 1, wherein a number of antenna patches is between four and eight.

9. An antenna module, comprising:
a radio frequency front-end (RFFE) die in a first plane defined in linear co-ordinates by a first axis and an orthogonal second axis; and
a plurality of antenna patches with the antenna patches arranged in a linear array in a second plane,
wherein:
the second plane is parallel to the first plane and offset from the first plane along a third axis mutually orthogonal to the first axis and the second axis,
respective centers of the antenna patches are along the first axis,
each antenna patch is rotated around the second axis with non-zero angles between respective planes of each antenna patch and the RFFE die.

10. The antenna module of claim 9, further comprising an antenna patch fixture to maintain the antenna patches at the non-zero angles.

11. The antenna module of claim 9, wherein each antenna patch is rotated around its center relative to the first axis.

12. The antenna module of claim 9, wherein the antenna patches are arranged in an antenna board.

13. The antenna module of claim 12, wherein:
the RFFE die comprises RFFE circuitry,
the antenna module comprises another die including logic circuitry on the antenna board, and the logic circuitry is configured to control operations of the RFFE circuitry.

14. The antenna module of claim 13, wherein:
the die including the logic circuitry is in an integrated circuit (IC) package,
the RFFE die is in the antenna board, and the
IC package is coupled to a face of the antenna board.

15. The antenna module of claim 13, wherein the antenna module is to support communication in a plurality of frequencies.

16. An antenna module, comprising:
a plurality of antenna patches arranged in a planar array in a first plane defined in linear co-ordinates by a first axis and an orthogonal second axis; and
a radio frequency front-end (RFFE) die in a second plane parallel to the first plane and offset from the first plane along a third axis mutually orthogonal to the first axis and the second axis.

17. The antenna module of claim 16, wherein the RFFE die is smaller than any one of the antenna patches in the plurality of antenna patches.

18. The antenna module of claim 16, wherein:
the planar array comprises a first subset and a second subset,
the antenna patches in the first subset are to support communication at a first frequency, and
the antenna patches in the second subset are to support communication at a second frequency.

19. The antenna module of claim 18, further comprising a first integrated circuit (IC) package and a second IC package, wherein:
the first IC package is over the first subset,
the second IC package is over the second subset, and
the first IC package and the second IC package are in a third plane offset from the first plane along the third axis.

20. The antenna module of claim 16, wherein at least one antenna patch is rotationally offset from adjacent antenna patches.

* * * * *